(12) United States Patent
Kimura et al.

(10) Patent No.: US 7,923,896 B2
(45) Date of Patent: Apr. 12, 2011

(54) SURFACE ACOUSTIC WAVE DEVICE

(75) Inventors: Tetsuya Kimura, Omihachiman (JP); Michio Kadota, Kyoto (JP); Mari Yaoi, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/813,589

(22) Filed: Jun. 11, 2010

(65) Prior Publication Data

US 2010/0237741 A1  Sep. 23, 2010

Related U.S. Application Data

(63) Continuation of application No. PCT/JP2008/068839, filed on Oct. 17, 2008.

(30) Foreign Application Priority Data

Dec. 20, 2007 (JP) .................................. 2007-328823

(51) Int. Cl.
*H03H 9/25* (2006.01)
*H01L 41/047* (2006.01)

(52) U.S. Cl. ................. 310/313 A; 310/313 B; 310/364
(58) Field of Classification Search .............. 310/313 A, 310/313 B, 313 R, 364
See application file for complete search history.

(56) References Cited

U.S. PATENT DOCUMENTS

| | | | |
|---|---|---|---|
| 5,065,065 A | 11/1991 | Hikita et al. | |
| 7,425,788 B2 * | 9/2008 | Kadota et al. ............ | 310/313 B |
| 7,626,313 B2 * | 12/2009 | Yaoi et al. ................. | 310/313 B |
| 2004/0145431 A1 | 7/2004 | Nakao et al. | |
| 2004/0164644 A1 | 8/2004 | Nishiyama et al. | |
| 2007/0120439 A1 * | 5/2007 | Kadota et al. ............ | 310/313 R |
| 2010/0072856 A1 * | 3/2010 | Kadota et al. ............ | 310/313 B |

FOREIGN PATENT DOCUMENTS

| | | |
|---|---|---|
| JP | 52-048375 A | 4/1977 |
| JP | 63-260213 A | 10/1988 |
| JP | 01-103012 A | 4/1989 |
| JP | 02-311007 A | 12/1990 |
| JP | 2004-112748 A | 4/2004 |
| JP | 2004-254291 A | 9/2004 |
| JP | 2007-028196 A | 2/2007 |
| JP | 2009-194895 A * | 8/2009 |
| WO | 2006/011417 A1 | 2/2006 |

OTHER PUBLICATIONS

Official Communication issued in International Patent Application No. PCT/JP2008/068839, mailed on Jan. 13, 2009.

* cited by examiner

*Primary Examiner* — Thomas M Dougherty
(74) *Attorney, Agent, or Firm* — Keating & Bennett, LLP

(57) ABSTRACT

A surface acoustic wave device including an SiO film has improved frequency temperature characteristics, prevents an increase in insertion loss, obtains a reflection coefficient of an electrode that is sufficiently high, and achieves more preferable resonant characteristics and filter characteristics. The surface acoustic wave device includes a $LiNbO_3$ substrate having a plurality of grooves formed in an upper surface thereof, an IDT electrode primarily composed of Pt provided in the grooves, a $SiO_2$ layer arranged so as to cover the upper surface of the $LiNbO_3$ substrate and the IDT electrode, a surface of the $SiO_2$ layer is planarized, a response of a Rayleigh wave is utilized, and Euler angles of the $LiNbO_3$ substrate are in a range of $(0°±5°, 208°$ to $228°, 0°±5°)$.

4 Claims, 14 Drawing Sheets

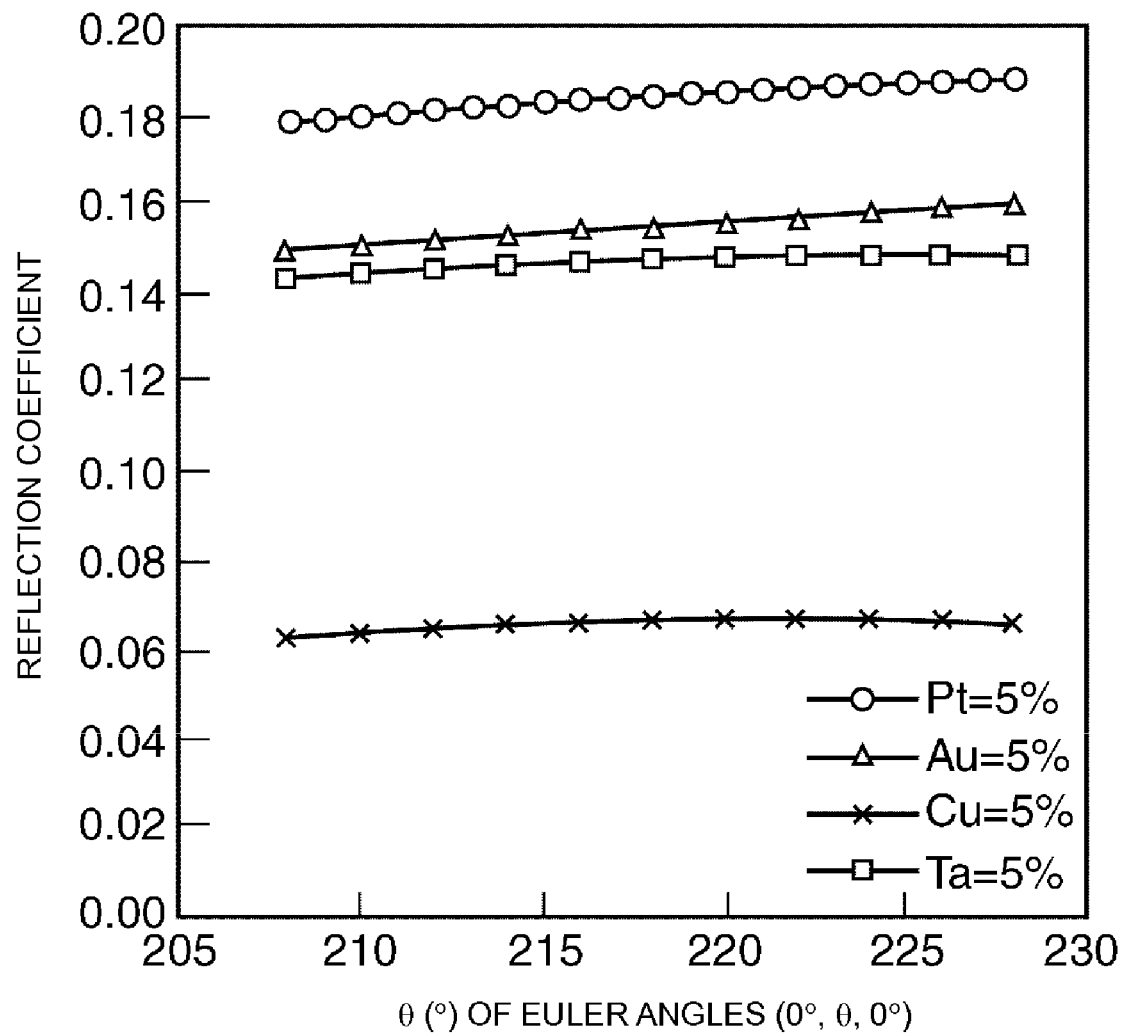

SURFACE ACOUSTIC WAVE DEVICE

BACKGROUND OF THE INVENTION

1. Field of the Invention

The present invention relates to a surface acoustic wave device in which a $SiO_2$ film is laminated so as to cover a piezoelectric substrate and an IDT electrode. Particularly, the present invention relates to a surface acoustic wave device in which an IDT electrode is composed of a metal filled in grooves located in an upper surface of a piezoelectric substrate.

2. Description of the Related Art

A duplexer (DPX) or an RF filter used for a mobile communication system, such as a mobile phone, is required to have both wide band characteristics and superior temperature characteristics. Previously, a surface acoustic wave device has been widely used as a DPX or an RF filter.

In particular, for the application described above, a surface acoustic wave device in which an IDT electrode is formed on a piezoelectric substrate of $LiTaO_3$ or $LiNbO_3$ has been widely used. $LiTaO_3$ and $LiNbO_3$ each have a negative temperature coefficient of frequency TCF. Hence, a method for improving temperature characteristics has been known in which a $SiO_2$ film having a positive temperature coefficient of frequency is formed on a piezoelectric substrate so as to cover an IDT electrode.

However, when a $SiO_2$ film is formed, at boundaries each between a portion at which an electrode finger of the IDT electrode is present and a portion at which no electrode finger thereof is present, steps are inevitably formed on the surface of the $SiO_2$ film. Accordingly, because of irregularities formed by the steps described above, an insertion loss is disadvantageously degraded.

In the following Japanese Unexamined Patent Application Publication No. 2004-112748, as a method for solving the problem described above, a method has been disclosed in which, after a first insulating layer having a thickness equal to that of an IDT electrode is formed between electrode fingers thereof, a $SiO_2$ film is formed so as to cover the IDT electrode and the first insulating layer. Since the first insulating layer is formed, an underlayer for the $SiO_2$ film becomes flat, so that the surface of the $SiO_2$ film can be planarized.

According to the surface acoustic wave device disclosed in Japanese Unexamined Patent Application Publication No. 2004-112748, the IDT electrode is formed of a single layer film composed of a metal having a density higher than that of Al or an alloy primarily including the above metal or is formed of a multilayer film composed of a film of a metal having a density higher than that of Al or an alloy primarily including the above metal and a film of another metal, and an electrode density of the IDT electrode is set to 1.5 times or more than that of the first insulating layer.

As described above, according to the surface acoustic wave device disclosed in Japanese Unexamined Patent Application Publication No. 2004-112748, since the IDT electrode primarily composed of a metal heavier than Al is used as described above, variation in acoustic velocity and/or frequency with respect to variation in electrode thickness is liable to increase. On the other hand, when the IDT electrode is formed from Al, it has been known that a reflection coefficient of the IDT electrode considerably decreases, and hence sufficient characteristics as a surface acoustic wave resonator and/or a surface acoustic wave filter cannot be obtained.

As a device which solves the problem described above, in the following WO2006/011417A1, there has been disclosed a surface acoustic wave device which has an IDT electrode composed of Al filled in a plurality of grooves formed in an upper surface of a piezoelectric substrate of $LiTaO_3$ or $LiNbO_3$. In the surface acoustic wave device disclosed in WO2006/011417A1, Al is filled in the grooves, so that the IDT electrode is formed. Furthermore, a $SiO_2$ film is laminated so as to cover the IDT electrode. Accordingly, since an underlayer for the $SiO_2$ film is planarized, the surface of the $SiO_2$ film can be planarized.

In addition, according to WO2006/011417A1, a $LiTaO_3$ substrate having specific Euler angles or a $LiNbO_3$ substrate having Euler angles (0°, 85° to 120°, 0°), (0°, 125° to 141°, 0°), (0°, 145° to 164°, 0°), or (0°, 160° to 180°, 0°) are preferably used, and a $LiNbO_3$ substrate having Euler angles (0°, 90° to 110°, 0°), (0°, 125° to 136°, 0°), (0°, 149° to 159°, 0°), or (0°, 165° to 175°, 0°) is more preferably used.

In the structure in which a $SiO_2$ film is laminated on an IDT electrode composed of Al in order to improve frequency temperature characteristics, the reflection coefficient described above decreases, and the characteristics are liable to be degraded. On the other hand, according to the structure disclosed in WO2006/011417A1, the IDT electrode composed of Al is embedded in the grooves provided in the piezoelectric substrate. Hence, the reflection coefficient of the electrode is made sufficiently high. Furthermore, since the $SiO_2$ film is formed, the frequency temperature characteristics are improved. In addition, since the surface of the $SiO_2$ film is planarized, the insertion loss is not likely to increase.

SUMMARY OF THE INVENTION

However, the inventors of the present invention discovered that when the surface acoustic wave device disclosed in WO2006/011417A1 is formed using a $LiNbO_3$ substrate to utilize a response of a Rayleigh wave, a large spurious response occurs in the vicinity of an attenuation pole of a main response. Hence, by the spurious response, filter characteristics and/or resonance characteristics may be degraded.

Accordingly, preferred embodiments of the present invention provide a surface acoustic wave device that overcomes the above problems of the related art in which the frequency temperature characteristics are improved by forming a $SiO_2$ film, an increase in insertion loss is not likely to occur thereby, and the reflection coefficient of an electrode can be made sufficiently high, and in which furthermore, since the undesired spurious response described above is suppressed, more preferable resonance characteristics and/or filter characteristics are obtained.

A surface acoustic wave device according to a preferred embodiment of the present invention includes: a piezoelectric substrate including grooves located in an upper surface thereof; an IDT electrode primarily defined by Pt located in the grooves; and a $SiO_2$ layer which is arranged over the piezoelectric substrate and the IDT electrode and the upper surface of which is flat, and in the surface acoustic wave device described above, a response of a Rayleigh wave excited in the piezoelectric substrate is utilized, and the piezoelectric substrate is a $LiNbO_3$ substrate having Euler angles in the range of (0°±5°, 208° to 228°, 0°±5°).

Pt is commonly used for an electrode forming an IDT electrode of a surface acoustic wave device, and when a metal primarily defined by Pt is filled in the grooves located in the piezoelectric substrate, the reflection coefficient of the electrode can be made sufficiently high.

The IDT electrode may be composed of an alloy primarily including Pt. In addition, the IDT electrode may be a laminated metal film. For example, the IDT electrode may be a laminated metal film in which a film composed of an alloy primarily including at least one metal selected from the group consisting of Ti, Ni, Cr, NiCr, Al, and AlCu is laminated on a film composed of Pt or an alloy primarily including Pt and may be a laminated metal film primarily including Pt as a whole.

In the surface acoustic wave device according to a preferred embodiment of the present invention, a normalized film thickness (%) obtained by normalizing a film thickness of the IDT electrode by a wavelength $\lambda$ of a surface acoustic wave, a normalized film thickness (%) obtained by normalizing the film thickness of a $SiO_2$ film by the wavelength $\lambda$ of the surface acoustic wave, and $\theta$ (degree) of Euler angles ($\phi$, $\theta$, $\psi$) of $LiNbO_3$ are preferably set in the ranges of each combination shown in the following Table 1.

TABLE 1

| IDT ELECTRODE (%) | $SiO_2$ LAYER (%) | (1) $\theta$ (DEGREE) TO SATISFY $0.08 \leq K^2$ OF RAYLEIGH WAVE |
|---|---|---|
| $1.5 \leq$ FILM THICKNESS OF IDT ELECTRODE $< 2.5$ | $7.5 \leq$ FILM THICKNESS OF $SiO_2$ LAYER $< 12.5$ | $208 \leq \theta \leq 227$ |
| | $12.5 \leq$ FILM THICKNESS OF $SiO_2$ LAYER $< 17.5$ | $208 \leq \theta \leq 228$ |
| | $17.5 \leq$ FILM THICKNESS OF $SiO_2$ LAYER $< 22.5$ | $208 \leq \theta \leq 228$ |
| | $22.5 \leq$ FILM THICKNESS OF $SiO_2$ LAYER $< 27.5$ | $208 \leq \theta \leq 227$ |
| | $27.5 \leq$ FILM THICKNESS OF $SiO_2$ LAYER $< 32.5$ | $209 \leq \theta \leq 226$ |
| | $32.5 \leq$ FILM THICKNESS OF $SiO_2$ LAYER $< 37.5$ | $211 \leq \theta \leq 225$ |
| $2.5 \leq$ FILM THICKNESS OF IDT ELECTRODE $< 3.5$ | $7.5 \leq$ FILM THICKNESS OF $SiO_2$ LAYER $< 12.5$ | $208 \leq \theta \leq 228$ |
| | $12.5 \leq$ FILM THICKNESS OF $SiO_2$ LAYER $< 17.5$ | $208 \leq \theta \leq 228$ |
| | $17.5 \leq$ FILM THICKNESS OF $SiO_2$ LAYER $< 22.5$ | $208 \leq \theta \leq 228$ |
| | $22.5 \leq$ FILM THICKNESS OF $SiO_2$ LAYER $< 27.5$ | $209 \leq \theta \leq 228$ |
| | $27.5 \leq$ FILM THICKNESS OF $SiO_2$ LAYER $< 32.5$ | $209 \leq \theta \leq 227$ |
| | $32.5 \leq$ FILM THICKNESS OF $SiO_2$ LAYER $< 37.5$ | $210 \leq \theta \leq 226$ |
| $3.5 \leq$ FILM THICKNESS OF IDT ELECTRODE $< 4.5$ | $7.5 \leq$ FILM THICKNESS OF $SiO_2$ LAYER $< 12.5$ | $208 \leq \theta \leq 228$ |
| | $12.5 \leq$ FILM THICKNESS OF $SiO_2$ LAYER $< 17.5$ | $208 \leq \theta \leq 228$ |
| | $17.5 \leq$ FILM THICKNESS OF $SiO_2$ LAYER $< 22.5$ | $210 \leq \theta \leq 228$ |
| | $22.5 \leq$ FILM THICKNESS OF $SiO_2$ LAYER $< 27.5$ | $212 \leq \theta \leq 226$ |
| | $27.5 \leq$ FILM THICKNESS OF $SiO_2$ LAYER $< 32.5$ | $214 \leq \theta \leq 224$ |
| | $32.5 \leq$ FILM THICKNESS OF $SiO_2$ LAYER $< 37.5$ | $214 \leq \theta \leq 223$ |
| $4.5 \leq$ FILM THICKNESS OF IDT ELECTRODE $< 5.5$ | $7.5 \leq$ FILM THICKNESS OF $SiO_2$ LAYER $< 12.5$ | $209 \leq \theta \leq 227$ |
| | $12.5 \leq$ FILM THICKNESS OF $SiO_2$ LAYER $< 17.5$ | $211 \leq \theta \leq 228$ |
| | $17.5 \leq$ FILM THICKNESS OF $SiO_2$ LAYER $< 22.5$ | — |
| | $22.5 \leq$ FILM THICKNESS OF $SiO_2$ LAYER $< 27.5$ | — |
| | $27.5 \leq$ FILM THICKNESS OF $SiO_2$ LAYER $< 32.5$ | — |
| | $32.5 \leq$ FILM THICKNESS OF $SiO_2$ LAYER $< 37.5$ | — |

When the normalized film thickness of the IDT electrode, the normalized film thickness of the $SiO_2$ film, and the Euler angles of $LiNbO_3$ are in the ranges of each combination shown in Table 1, the undesired spurious response can be effectively suppressed.

More preferably, the normalized film thickness (%) of the IDT electrode, the normalized film thickness (%) of the $SiO_2$ film, and the $\theta$ (degree) of the Euler angles ($\phi$, $\theta$, $\psi$) of $LiNbO_3$ are in the ranges of each combination shown in the following Table 2.

TABLE 2

| IDT ELECTRODE (%) | $SiO_2$ LAYER (%) | (1) AND (2) $\theta$ (DEGREE) TO SATISFY $0.02 > K^2$ OF SH WAVE |
|---|---|---|
| $1.5 \leq$ FILM THICKNESS OF IDT ELECTRODE $< 2.5$ | $7.5 \leq$ FILM THICKNESS OF $SiO_2$ LAYER $< 12.5$ | $208 \leq \theta \leq 222$ |
| | $12.5 \leq$ FILM THICKNESS OF $SiO_2$ LAYER $< 17.5$ | $208 \leq \theta \leq 222$ |
| | $17.5 \leq$ FILM THICKNESS OF $SiO_2$ LAYER $< 22.5$ | $208 \leq \theta \leq 222$ |
| | $22.5 \leq$ FILM THICKNESS OF $SiO_2$ LAYER $< 27.5$ | $208 \leq \theta \leq 222$ |
| | $27.5 \leq$ FILM THICKNESS OF $SiO_2$ LAYER $< 32.5$ | $209 \leq \theta \leq 223$ |
| | $32.5 \leq$ FILM THICKNESS OF $SiO_2$ LAYER $< 37.5$ | $211 \leq \theta \leq 225$ |
| $2.5 \leq$ FILM THICKNESS OF IDT ELECTRODE $< 3.5$ | $7.5 \leq$ FILM THICKNESS OF $SiO_2$ LAYER $< 12.5$ | $208 \leq \theta \leq 221$ |
| | $12.5 \leq$ FILM THICKNESS OF $SiO_2$ LAYER $< 17.5$ | $208 \leq \theta \leq 221$ |
| | $17.5 \leq$ FILM THICKNESS OF $SiO_2$ LAYER $< 22.5$ | $208 \leq \theta \leq 222$ |
| | $22.5 \leq$ FILM THICKNESS OF $SiO_2$ LAYER $< 27.5$ | $209 \leq \theta \leq 222$ |
| | $27.5 \leq$ FILM THICKNESS OF $SiO_2$ LAYER $< 32.5$ | $209 \leq \theta \leq 222$ |
| | $32.5 \leq$ FILM THICKNESS OF $SiO_2$ LAYER $< 37.5$ | $210 \leq \theta \leq 223$ |
| $3.5 \leq$ FILM THICKNESS OF IDT ELECTRODE $< 4.5$ | $7.5 \leq$ FILM THICKNESS OF $SiO_2$ LAYER $< 12.5$ | $208 \leq \theta \leq 220$ |
| | $12.5 \leq$ FILM THICKNESS OF $SiO_2$ LAYER $< 17.5$ | $208 \leq \theta \leq 222$ |
| | $17.5 \leq$ FILM THICKNESS OF $SiO_2$ LAYER $< 22.5$ | $210 \leq \theta \leq 223$ |
| | $22.5 \leq$ FILM THICKNESS OF $SiO_2$ LAYER $< 27.5$ | $212 \leq \theta \leq 224$ |
| | $27.5 \leq$ FILM THICKNESS OF $SiO_2$ LAYER $< 32.5$ | $214 \leq \theta \leq 224$ |
| | $32.5 \leq$ FILM THICKNESS OF $SiO_2$ LAYER $< 37.5$ | $214 \leq \theta \leq 223$ |

TABLE 2-continued

| IDT ELECTRODE (%) | SiO$_2$ LAYER (%) | (1) AND (2) θ (DEGREE) TO SATISFY 0.02 > K$^2$ OF SH WAVE |
|---|---|---|
| 4.5 ≦ FILM THICKNESS OF IDT ELECTRODE < 5.5 | 7.5 ≦ FILM THICKNESS OF SiO$_2$ LAYER < 12.5 | 209 ≦ θ ≦ 222 |
| | 12.5 ≦ FILM THICKNESS OF SiO$_2$ LAYER < 17.5 | 211 ≦ θ ≦ 224 |
| | 17.5 ≦ FILM THICKNESS OF SiO$_2$ LAYER < 22.5 | — |
| | 22.5 ≦ FILM THICKNESS OF SiO$_2$ LAYER < 27.5 | — |
| | 27.5 ≦ FILM THICKNESS OF SiO$_2$ LAYER < 32.5 | — |
| | 32.5 ≦ FILM THICKNESS OF SiO$_2$ LAYER < 37.5 | — |

In the surface acoustic wave device according to a preferred embodiment of the present invention, the IDT electrode primarily including Pt is provided in a plurality of the grooves disposed in the upper surface of the piezoelectric substrate, the SiO$_2$ layer is arranged so as to cover the piezoelectric substrate and the IDT electrode, and the upper surface of the SiO$_2$ layer is flat. Hence, by the SiO$_2$ layer, the temperature coefficient of frequency can be improved, and in addition, since the upper surface of the SiO$_2$ film is planarized, an increase in insertion loss caused by the formation of the SiO$_2$ film is not likely to occur.

In addition, since the IDT electrode is formed by being filled in the grooves, and the reflection coefficient of the IDT electrode is not likely to receive an influence of the SiO$_2$ layer, a sufficiently high reflection coefficient can be obtained. In addition, since the response of the Rayleigh wave is utilized, and a LiNbO$_3$ substrate having the above specific Euler angles is used as the piezoelectric substrate, as apparent from the experimental examples which will be described later, a spurious response generated in the vicinity of an attenuation pole of a main response can be effectively suppressed, and superior frequency characteristics can be obtained.

These and other elements, features, steps, characteristics and advantages of the present invention will become more apparent from the following detailed description of the preferred embodiments with reference to the attached drawings.

BRIEF DESCRIPTION OF THE DRAWINGS

FIG. 26 is a view showing the relationship between the reflection coefficient per one electrode finger and the Euler angle θ which is obtained when an electrode of Pt, Au, Cu, or Ta is formed in grooves formed in a LiNbO₃ substrate having Euler angles (0°, θ, 0°) so as to have a normalized film thickness h/λ of about 5%.

DETAILED DESCRIPTION OF THE PREFERRED EMBODIMENTS

Figure 1:
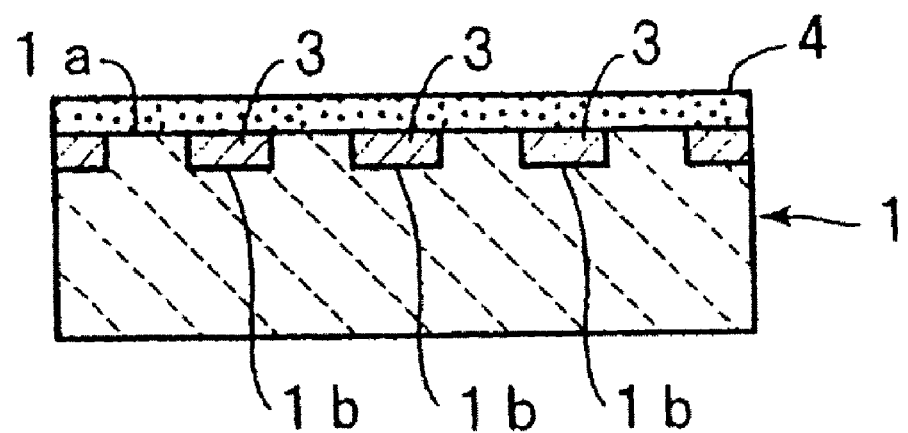
FIG. 1 is a schematic front cross-sectional view of a surface acoustic wave device according to one preferred embodiment of the present invention.
Figure 2:
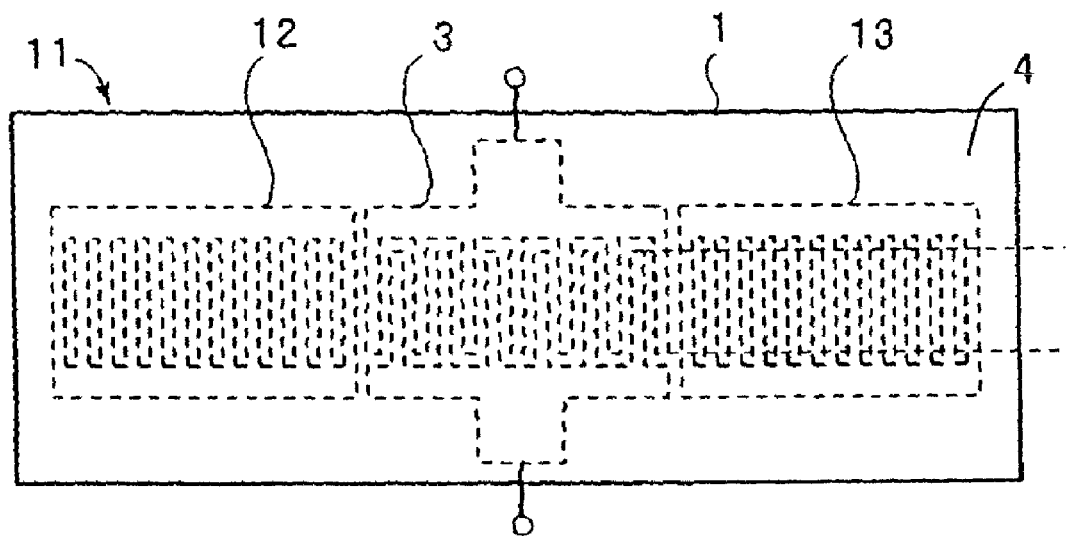
FIG. 2 is a schematic plan view of a surface acoustic wave device according to one preferred embodiment of the present invention.

FIG. 1 is a schematic front cross-sectional view of a surface acoustic wave device according to one preferred embodiment of the present invention, and FIG. 2 is a schematic plan view of the surface acoustic wave device according to this preferred embodiment.

As shown in FIG. 2, a surface acoustic wave device 11 has a LiNbO₃ substrate 1. In an upper surface 1a of this LiNbO₃ substrate 1, a plurality of grooves 1b is provided and arranged as shown in FIG. 1. An IDT electrode 3 is defined by a metal filled in the grooves 1b.

That is, the IDT electrode 3 is defined by a metal primarily composed of Pt embedded in the grooves 1b so that the upper surface 1a of the LiNbO₃ substrate 1 and an upper surface of the IDT electrode 3 are flush with each other.

As shown in FIG. 2, at two sides of the IDT electrode 3 in a direction of surface acoustic wave propagation, reflectors 12 and 13 are disposed. As in the case of the IDT electrode 3, the reflectors 12 and 13 are also preferably formed by filling a metal in a plurality of grooves formed in the upper surface 1a of the LiNbO₃ substrate 1. Accordingly, the upper surface of the LiNbO₃ substrate 1 in which the electrode 3 and the reflectors 12 and 13 are formed is flat.

As shown in FIGS. 1 and 2, a SiO₂ layer 4 is arranged so as to cover the LiNbO₃ substrate 1, the IDT electrode 3, and the reflectors 12 and 13.

Figures 3A, 3B, 3C, 3D, 3E:
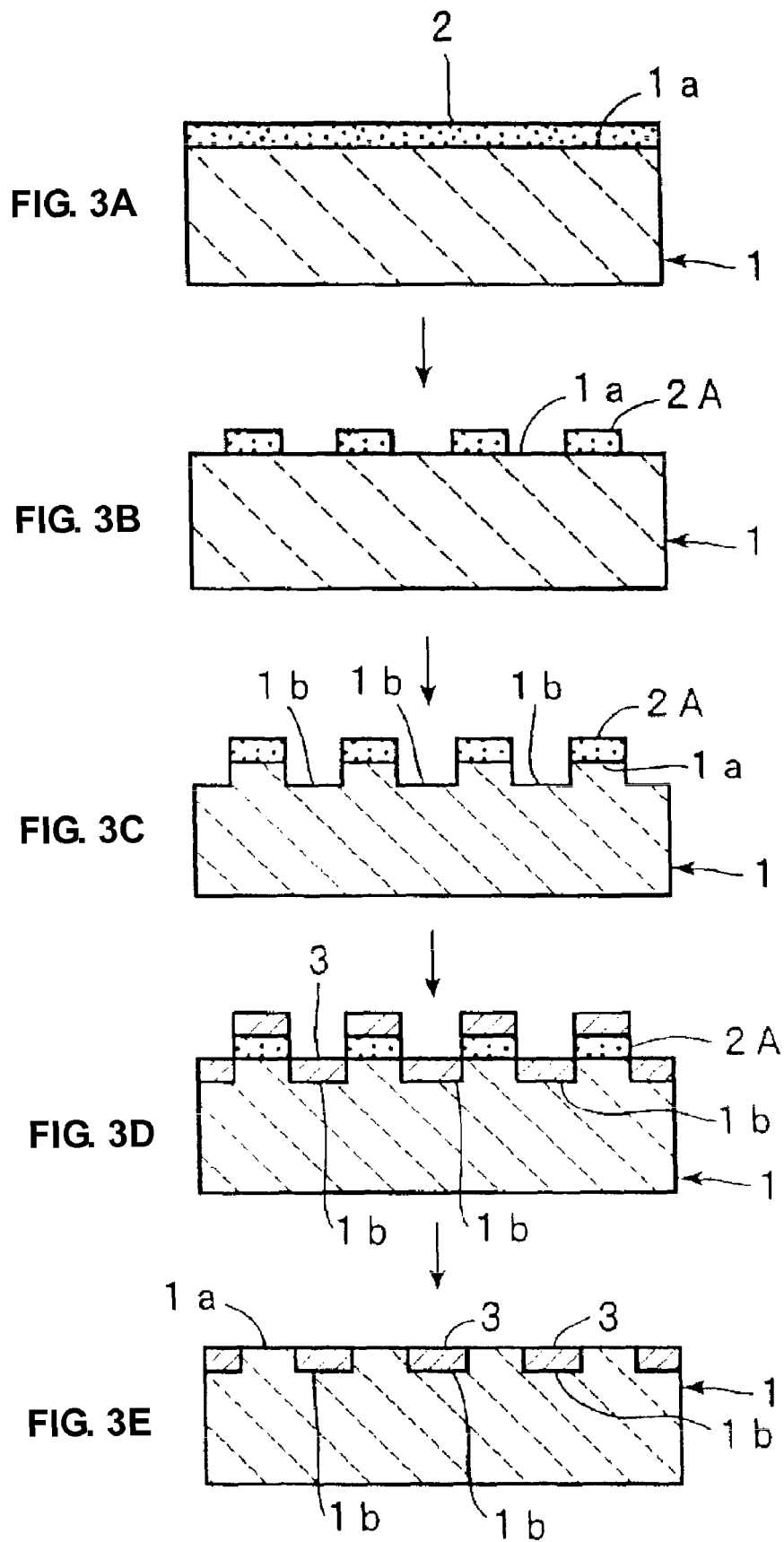
FIGS. 3A to 3E are each a schematic front cross-sectional view illustrating a method for manufacturing a surface acoustic wave device according to a preferred embodiment of the present invention.

The surface acoustic wave device 1 can be obtained through steps shown in FIGS. 3A to 3E. That is, as shown in FIGS. 3A and 3B, after a photoresist 2 is formed on the entire surface of the LiNbO₃ substrate 1, patterning of the photoresist 2 is performed by a photolithographic method to form a photoresist pattern 2A. Next, as shown in FIG. 3C, the LiNbO₃ substrate 1 is etched to form the grooves 1b. Next, as shown in FIG. 3D, a film of Pt having a predetermined thickness is formed. Thus, Pt is embedded in the grooves 1b, thereby forming the IDT electrode 3. The thickness of this Pt preferably is set equivalent to the depth of the grooves 1b. Next, as shown in FIG. 3E, the photoresist pattern 2A and Pt provided thereon are removed by lift-off. Then, the SiO₂ layer 4 is formed by an appropriate film forming method, such as deposition or sputtering, so that the SiO₂ layer 4 having a flat upper surface shown in FIG. 1 can be formed.

Some of the unique features of the surface acoustic wave device 11 of this preferred embodiment are that a response of a Rayleigh wave as a surface acoustic wave is utilized and that Euler angles of the LiNbO$_3$ substrate are in the range of (0°±5°, 208° to 228°, 0°±5°). As a result, a spurious response generated in the vicinity of an attenuation pole of a main response can be effectively suppressed.

As described above, in the surface acoustic wave device disclosed in WO2006/011417A1, a large spurious response is occasionally generated in the vicinity of an attenuation pole of a main response. Accordingly, intensive research on the above point was further carried out by the inventors of the present invention, and as a result, the present inventors discovered that when a LiNbO$_3$ substrate having Euler angles in the specific range described above is used, the spurious response in the vicinity of an attenuation pole of a main response can be suppressed. That is, the suppression of the above spurious response achieved by using a LiNbO$_3$ substrate having the above specific Euler angles was not based on an experiment performed on the estimation in which the effect as described above is obtained but was newly discovered by the inventors of the present invention.

Hereinafter, the suppression of the spurious response effectively achieved by setting the Euler angles of a LiNbO$_3$ substrate in the above specific range will be described with reference to particular experimental examples.

After a LiNbO$_3$ substrate having Euler angles (0°, 216°, 0°) was prepared as the LiNbO$_3$ substrate 1, as shown in FIGS. 1 and 2, Pt was embedded in the grooves 1b to form the IDT electrode 3 and the reflectors 12 and 13, and the SiO$_2$ layer 4 was further formed. In this case, the film thickness of the electrode was variously changed, and as for the film thickness of a SiO$_2$ film 4, h/λ was set to approximately 20%, 25%, or 30%, for example. The relationship between an electromechanical coupling coefficient $K_R^2$ of the Rayleigh wave and the film thickness of the IDT electrode 3 of each surface acoustic wave device thus obtained is shown in FIG. 4.

Figure 4:
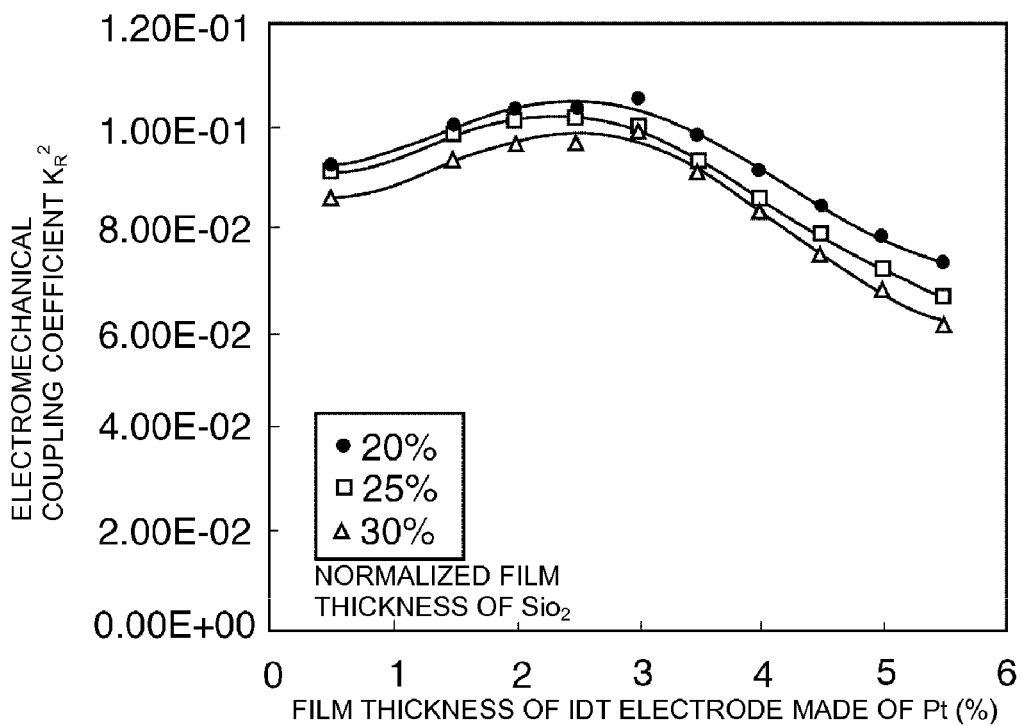
FIG. 4 is a view showing the change in electromechanical coupling coefficient of a Rayleigh wave obtained when a LiNbO$_3$ substrate having an Euler angle θ of 216° is used and a normalized film thickness h/λ×100(%) of an electrode is changed.

The horizontal axis in FIG. 4 indicates a normalized film thickness h/λ×100(%) of the IDT electrode 3. Where, h indicates the film thickness of the IDT electrode 3, and λ indicates the wavelength of the Rayleigh wave.

As apparent from FIG. 4, it is found that when the film thickness of the SiO$_2$ film 4 and the normalized film thickness of the IDT electrode 3 are set in the specific ranges, the electromechanical coupling coefficient $K_R^2$ of the Rayleigh wave can be increased.

In addition, the inventors of the present invention discovered that when the Rayleigh wave is utilized, a spurious response generated in the vicinity of an attenuation pole of a main response is caused by a response of an SH wave when it is excited.

Under conditions in which Y-cut X-propagation LiNbO$_3$ substrates having various Euler angles were used, Pt was used as an electrode material, the normalized film thickness h/λ (%) of the IDT electrode 3 was set to approximately 1.5%, 2%, 2.5%, 3%, 3.5%, 4%, 4.5%, 5%, or 5.5%, and the normalized film thickness h/λ of the SiO$_2$ layer 4 was changed in the range of about 10% to about 35%, many surface acoustic wave devices were formed. For the surface acoustic wave devices described above, the electromechanical coupling coefficient $K_R^2$ of the Rayleigh wave and an electromechanical coupling coefficient $K_{SH}^2$ of an SH wave causing a spurious response to a main response of the Rayleigh wave were obtained. The results are shown in FIGS. 5 to 22.

Figure 5:
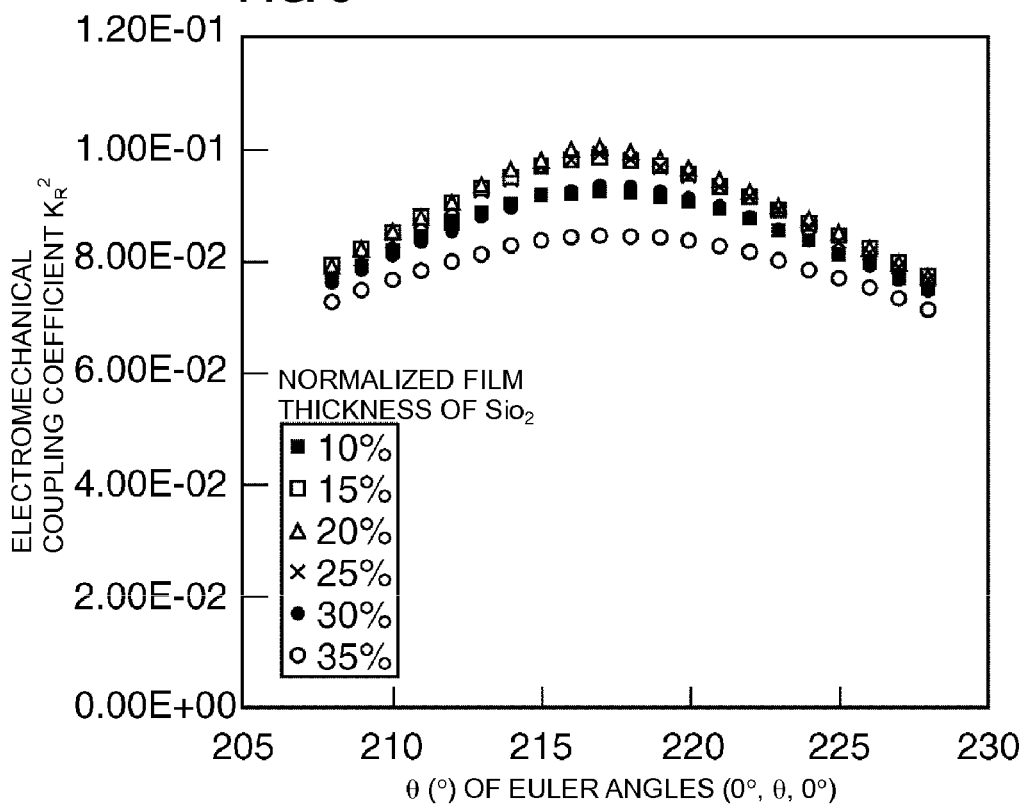
FIG. 5 is a view showing the relationship between an electromechanical coupling coefficient K$_R^2$ of the Rayleigh wave and the Euler angle θ which is obtained when grooves are formed in a LiNbO$_3$ substrate having Euler angles (0°, θ, 0°), an IDT electrode composed of Pt is formed to have a normalized film thickness of about 1.5(%), and SiO$_2$ layers having various film thicknesses are formed.
Figure 6:
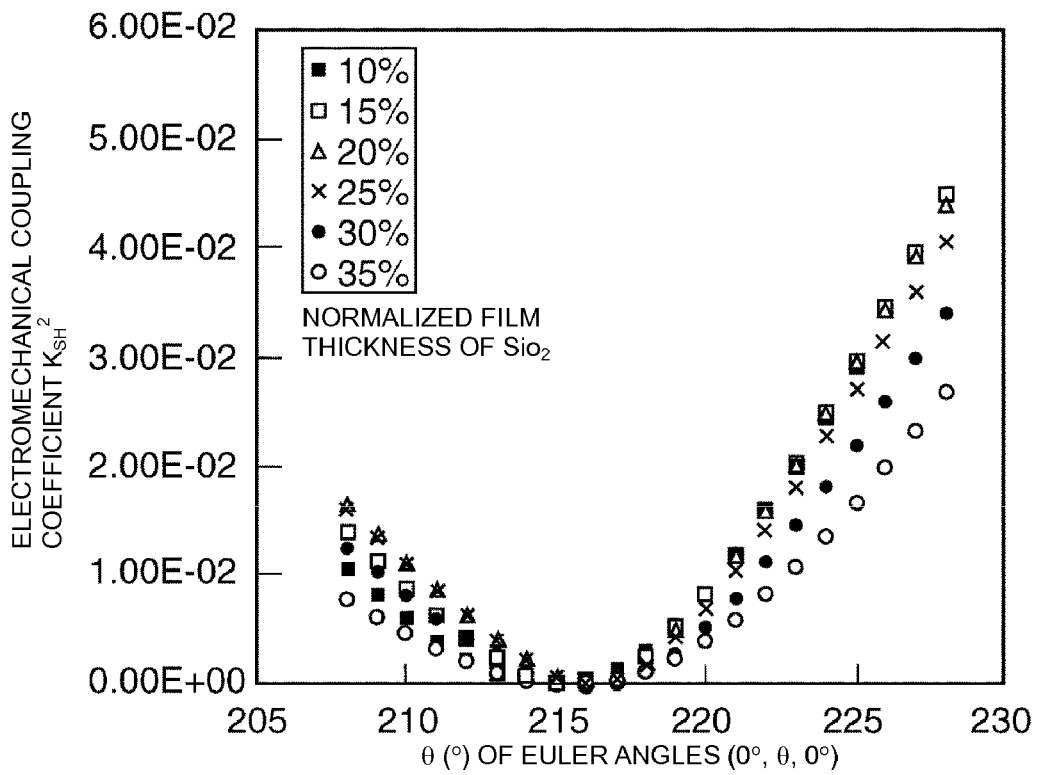
FIG. 6 is a view showing the relationship between an electromechanical coupling coefficient K$_{SH}^2$ of an SH wave and the Euler angle θ which is obtained when grooves are formed in a LiNbO$_3$ substrate having Euler angles (0°, θ, 0°), an IDT electrode composed of Pt is formed to have a normalized film thickness of about 1.5(%), and SiO$_2$ layers having various film thicknesses are formed.

FIG. 5 shows the electromechanical coupling coefficient $K_R^2$ of the Rayleigh wave when the normalized film thickness (%) of the IDT electrode 3 made of Pt is about 1.5%, and FIG. 6 shows the electromechanical coupling coefficient $K_{SH}^2$ of the SH wave.

As apparent from FIGS. 5 and 6, it is found that when the normalized film thickness of the IDT electrode 3 made of Pt is about 1.5%, and when the Euler angle θ is in the range of about 208° to about 228°, the electromechanical coupling coefficient $K_R^2$ of a main response of the Rayleigh wave can be set to about 0.08 or more regardless of the film thickness of the SiO$_2$ film 4, and that when the Euler angle θ is in the range of about 208° to about 225°, the electromechanical coupling coefficient $K_{SH}^2$ of the SH wave which causes the spurious response can be set to less than about 0.02 regardless of the film thickness of the SiO$_2$ film 4.

Figure 7:
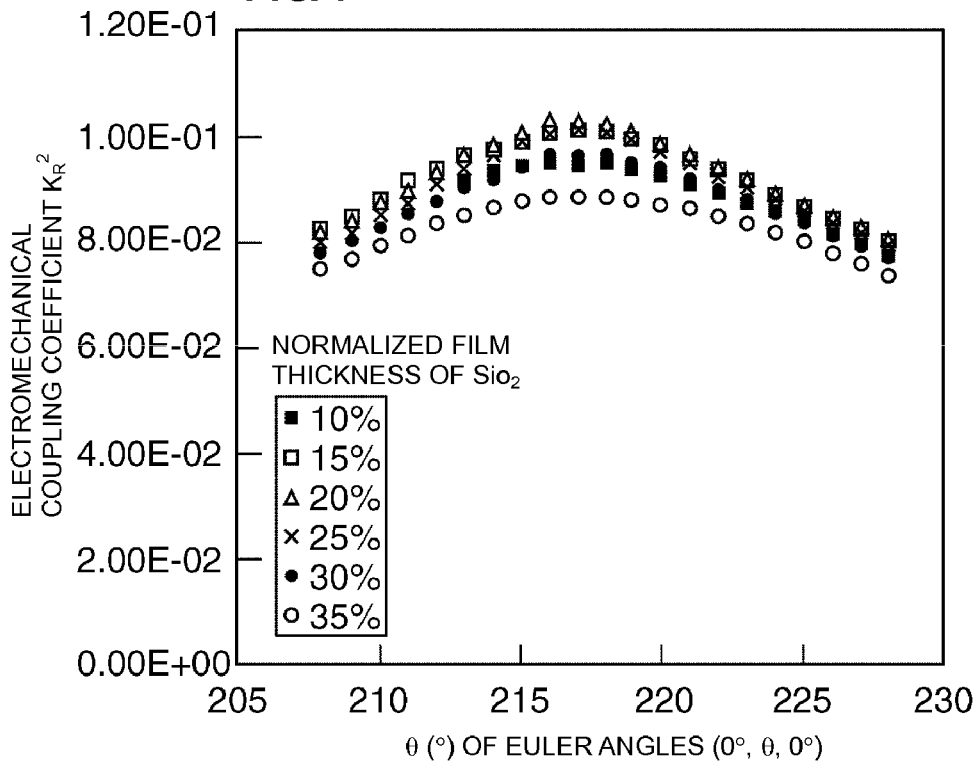
FIG. 7 is a view showing the relationship between the electromechanical coupling coefficient K$_R^2$ of the Rayleigh wave and the Euler angle θ which is obtained when an IDT electrode of Pt having a normalized film thickness of about 2% is formed in grooves formed in a LiNbO$_3$ substrate having Euler angles (0°, θ, 0°), and SiO$_2$ layers having various film thicknesses are formed.
Figure 8:
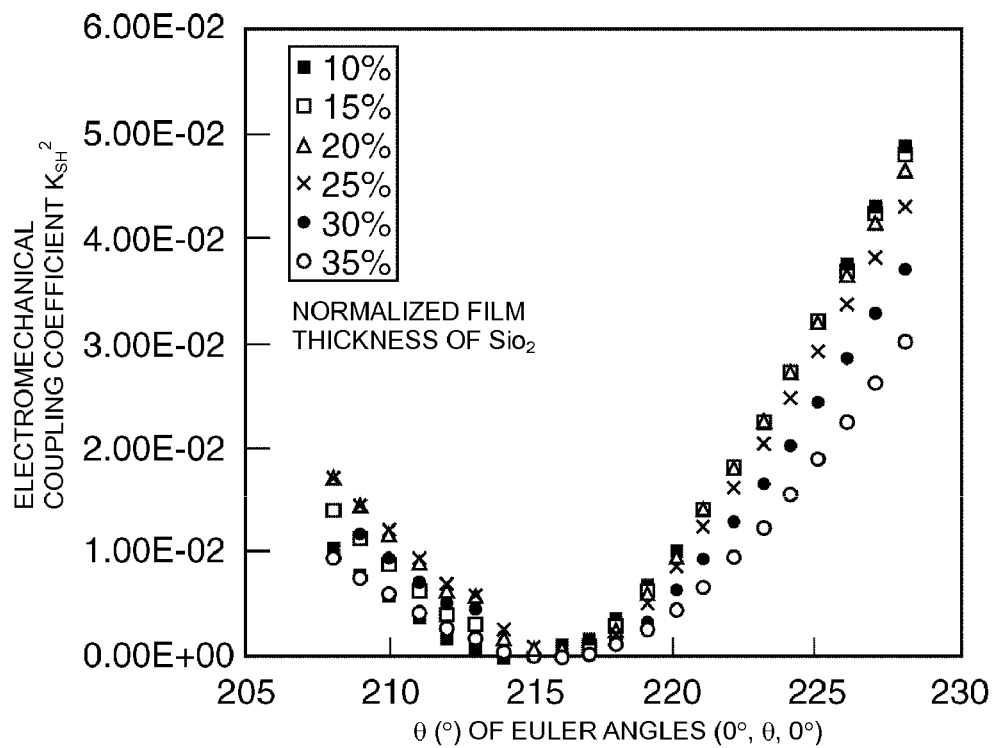
FIG. 8 is a view showing the relationship between the electromechanical coupling coefficient K$_{SH}^2$ of the SH wave and the Euler angle θ which is obtained when an IDT electrode of Pt having a normalized film thickness of about 2% is formed in grooves formed in a LiNbO$_3$ substrate having Euler angles (0°, θ, 0°), and SiO$_2$ layers having various film thicknesses are formed.

In addition, FIGS. 7 and 8 are views each showing the relationship between the Euler angle θ and the electromechanical coupling coefficient $K_R^2$ of the Rayleigh wave or the electromechanical coupling coefficient $K_{SH}^2$ of the SH wave which is obtained at each normalized film thickness of the SiO$_2$ film when the normalized film thickness h/λ of the IDT electrode 3 made of Pt is about 2%.

Figure 9:
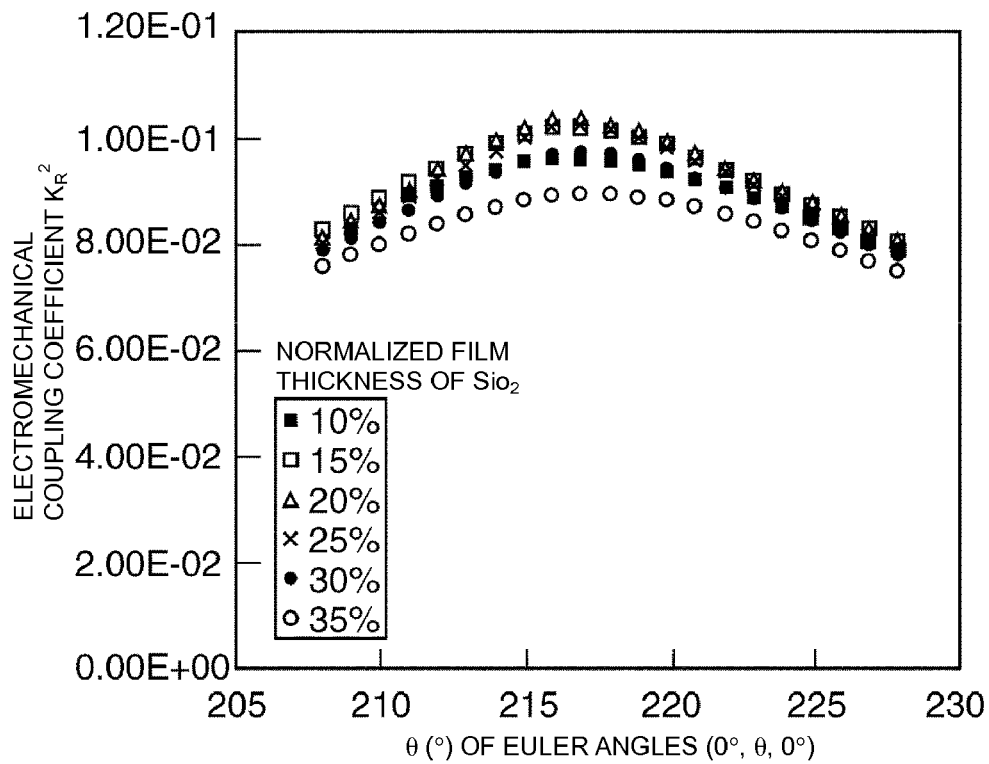
FIG. 9 is a view showing the relationship between the electromechanical coupling coefficient K$_R^2$ of the Rayleigh wave and the Euler angle θ which is obtained when an IDT electrode of Pt having a normalized film thickness of about 2.5% is formed in grooves formed in a LiNbO$_3$ substrate having Euler angles (0°, θ, 0°), and SiO$_2$ layers having various film thicknesses are formed.
Figure 10:
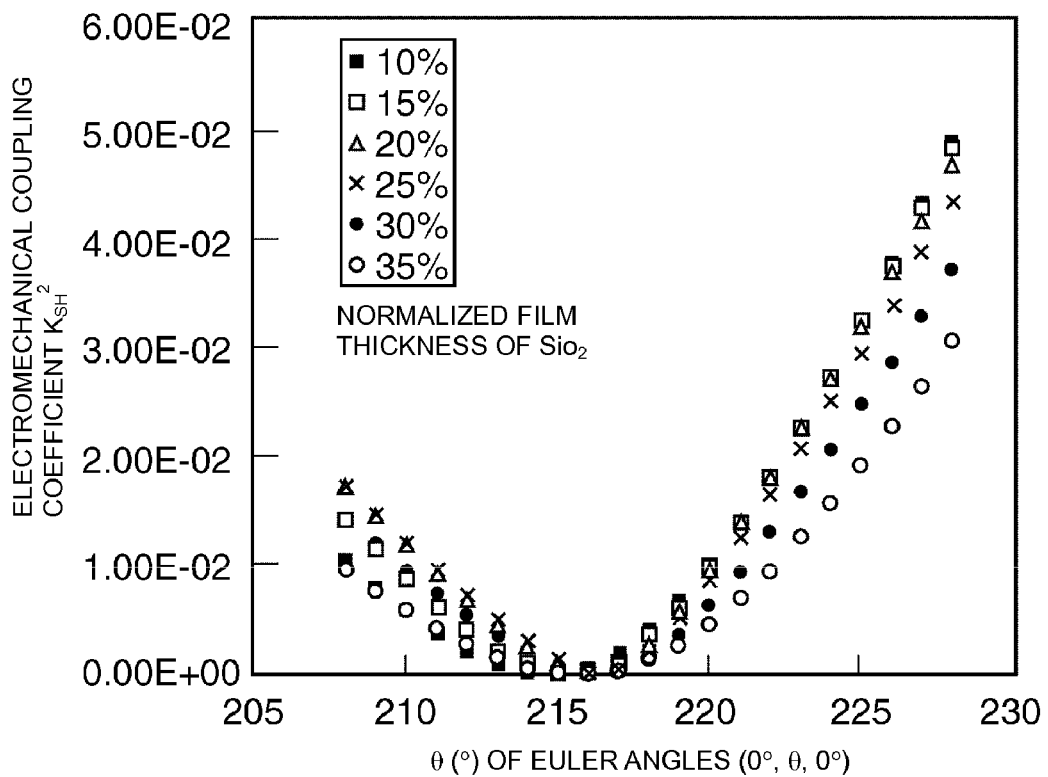
FIG. 10 is a view showing the relationship between the electromechanical coupling coefficient K$_{SH}^2$ of the SH wave and the Euler angle θ which is obtained when an IDT electrode of Pt having a normalized film thickness of about 2.5% is formed in grooves formed in a LiNbO$_3$ substrate having Euler angles (0°, θ, 0°), and SiO$_2$ layers having various film thicknesses are formed.

FIGS. 9 and 10 are views each showing the relationship between the Euler angle θ and the electromechanical coupling coefficient $K_R^2$ of the Rayleigh wave or the electromechanical coupling coefficient $K_{SH}^2$ of the SH wave which is obtained at each normalized film thickness of the SiO$_2$ film when the normalized film thickness h/λ of the IDT electrode 3 made of Pt is about 2.5%.

Figure 11:
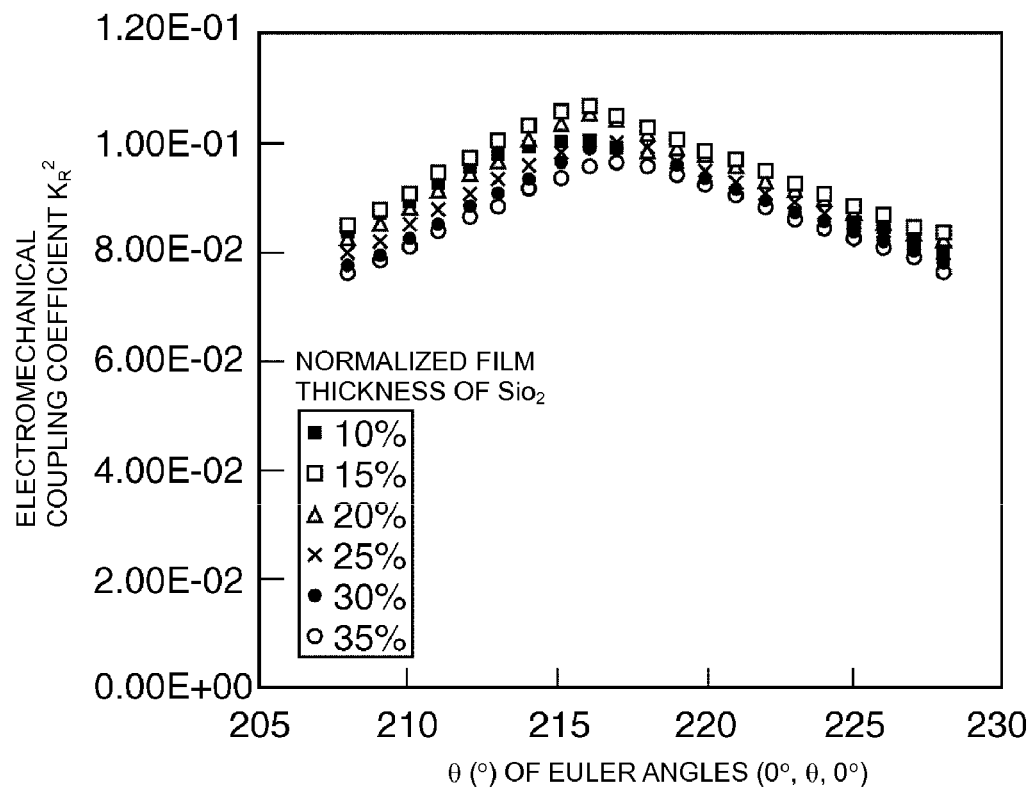
FIG. 11 is a view showing the relationship between the electromechanical coupling coefficient K$_R^2$ of the Rayleigh wave and the Euler angle θ which is obtained when an IDT electrode of Pt having a normalized film thickness of about 3% is formed in grooves formed in a LiNbO$_3$ substrate having Euler angles (0°, θ, 0°), and SiO$_2$ layers having various film thicknesses are formed.
Figure 12:
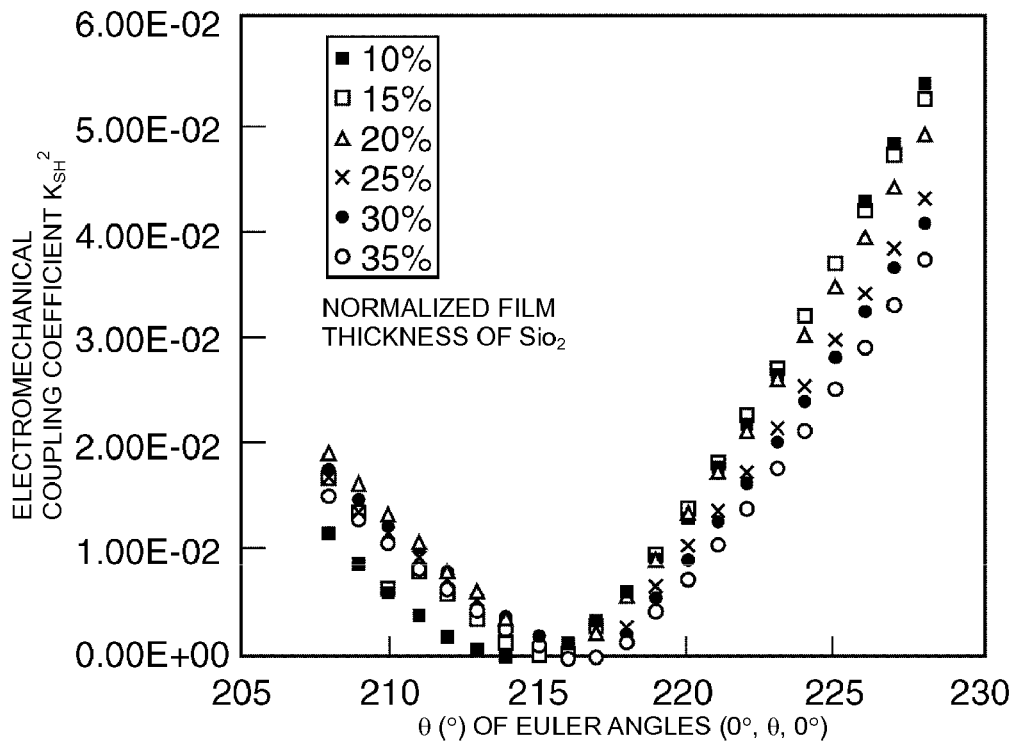
FIG. 12 is a view showing the relationship between the electromechanical coupling coefficient K$_{SH}^2$ of the SH wave and the Euler angle θ which is obtained when an IDT electrode of Pt having a normalized film thickness of about 3% is formed in grooves formed in a LiNbO$_3$ substrate having Euler angles (0°, θ, 0°), and SiO$_2$ layers having various film thicknesses are formed.

FIGS. 11 and 12 are views each showing the relationship between the Euler angle θ and the electromechanical coupling coefficient $K_R^2$ of the Rayleigh wave or the electromechanical coupling coefficient $K_{SH}^2$ of the SH wave which is obtained at each normalized film thickness of the SiO$_2$ film when the normalized film thickness h/λ of the IDT electrode 3 made of Pt is about 3%.

Figure 13:
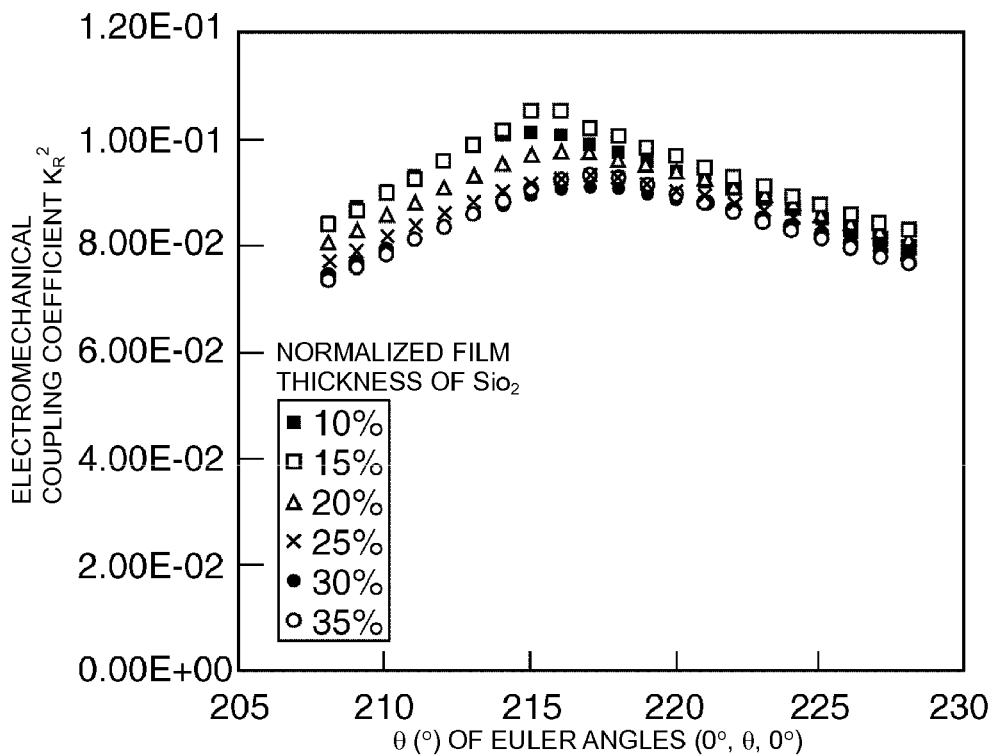
FIG. 13 is a view showing the relationship between the electromechanical coupling coefficient K$_R^2$ of the Rayleigh wave and the Euler angle θ which is obtained when an IDT electrode of Pt having a normalized film thickness of about 3.5% is formed in grooves formed in a LiNbO$_3$ substrate having Euler angles (0°, θ, 0°), and SiO$_2$ layers having various film thicknesses are formed.
Figure 14:
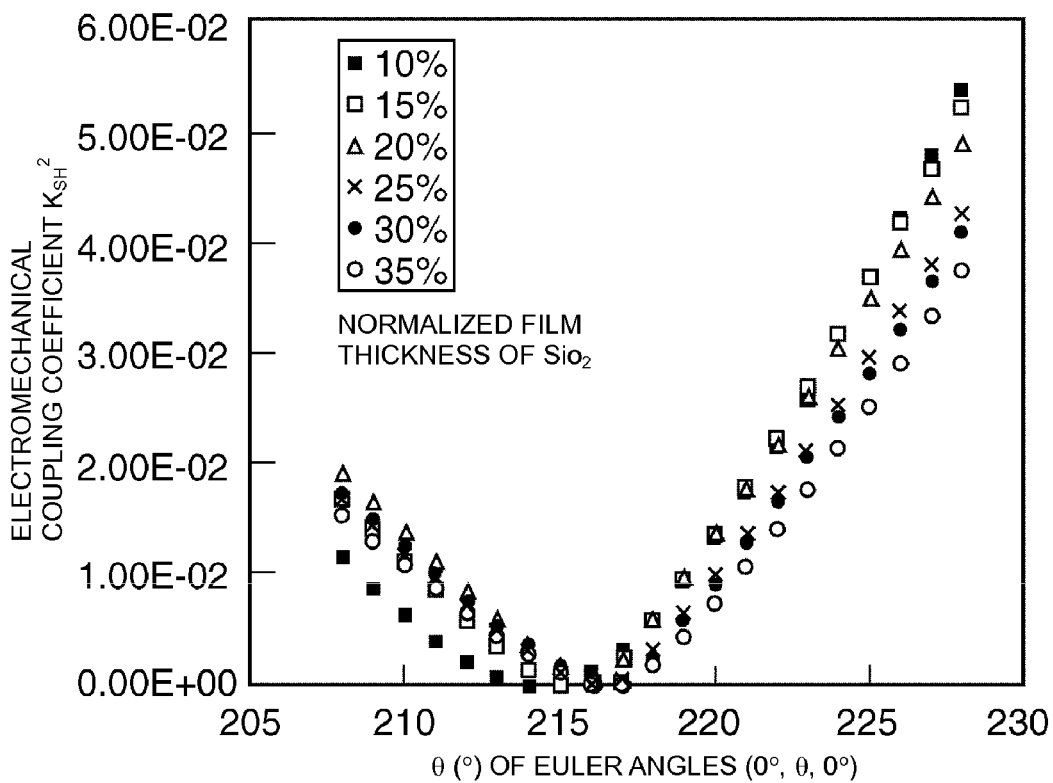
FIG. 14 is a view showing the relationship between the electromechanical coupling coefficient $K_{SH}^2$ of the SH wave and the Euler angle θ which is obtained when an IDT electrode of Pt having a normalized film thickness of about 3.5% is formed in grooves formed in a LiNbO₃ substrate having Euler angles (0°, θ, 0°), and SiO₂ layers having various film thicknesses are formed.

FIGS. 13 and 14 are views each showing the relationship between the Euler angle θ and the electromechanical coupling coefficient $K_R^2$ of the Rayleigh wave or the electromechanical coupling coefficient $K_{SH}^2$ of the SH wave which is obtained at each normalized film thickness of the SiO$_2$ film when the normalized film thickness h/λ of the IDT electrode 3 made of Pt is about 3.5%.

Figure 15:
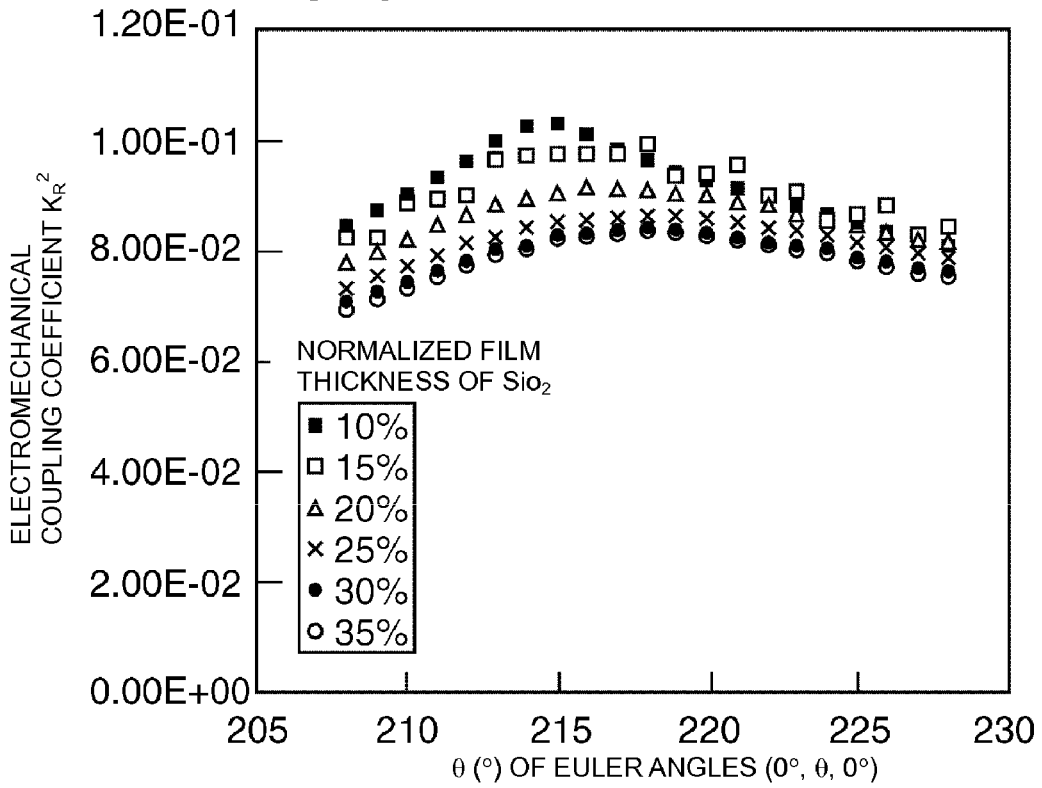
FIG. 15 is a view showing the relationship between the electromechanical coupling coefficient $K_R^2$ of the Rayleigh wave and the Euler angle θ which is obtained when an IDT electrode of Pt having a normalized film thickness of about 4% is formed in grooves formed in a LiNbO₃ substrate having Euler angles (0°, θ, 0°), and SiO₂ layers having various film thicknesses are formed.
Figure 16:
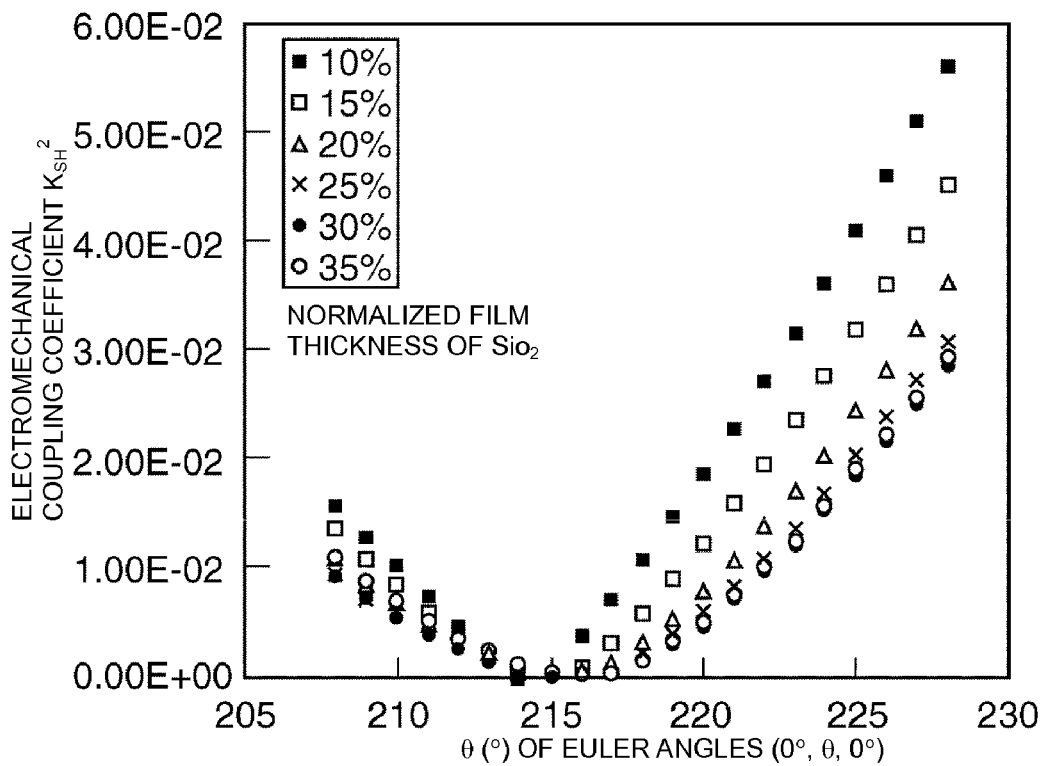
FIG. 16 is a view showing the relationship between the electromechanical coupling coefficient $K_{SH}^2$ of the SH wave and the Euler angle θ which is obtained when an IDT electrode of Pt having a normalized film thickness of about 4% is formed in grooves formed in a LiNbO₃ substrate having Euler angles (0°, θ, 0°), and SiO₂ layers having various film thicknesses are formed.

FIGS. 15 and 16 are views each showing the relationship between the Euler angle θ and the electromechanical coupling coefficient $K_R^2$ of the Rayleigh wave or the electromechanical coupling coefficient $K_{SH}^2$ of the SH wave which is obtained at each normalized film thickness of the SiO$_2$ film when the normalized film thickness h/λ of the IDT electrode 3 made of Pt is about 4%.

Figure 17:
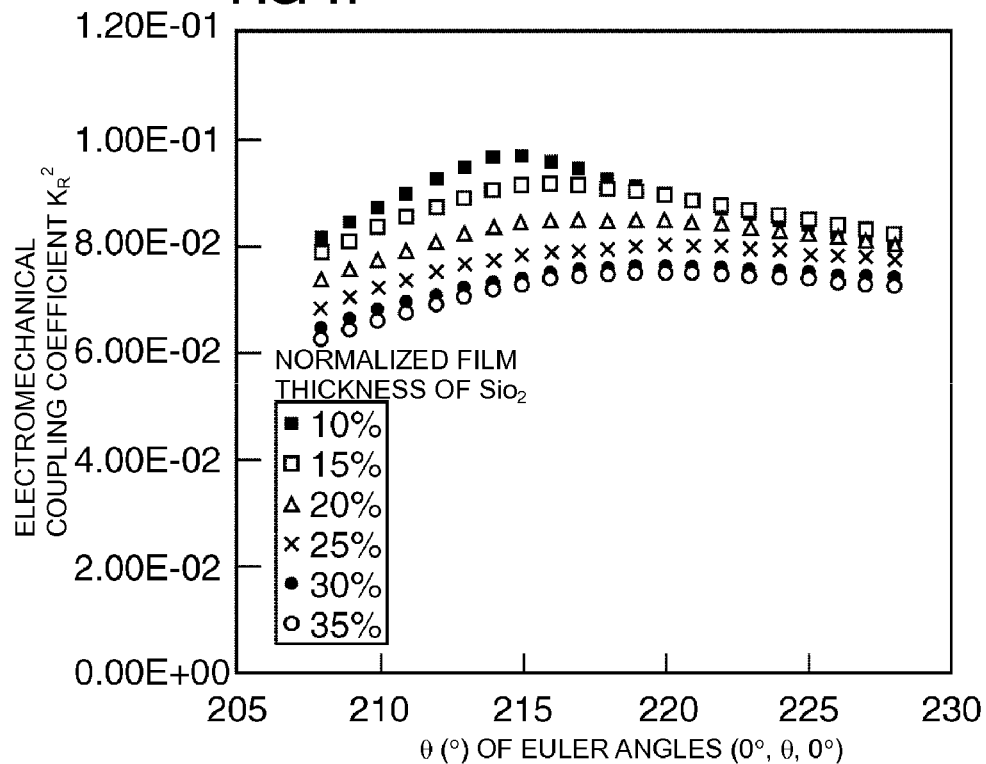
FIG. 17 is a view showing the relationship between the electromechanical coupling coefficient $K_R^2$ of the Rayleigh wave and the Euler angle θ which is obtained when an IDT electrode of Pt having a normalized film thickness of about 4.5% is formed in grooves formed in a LiNbO₃ substrate having Euler angles (0°, θ, 0°), and SiO₂ layers having various film thicknesses are formed.
Figure 18:
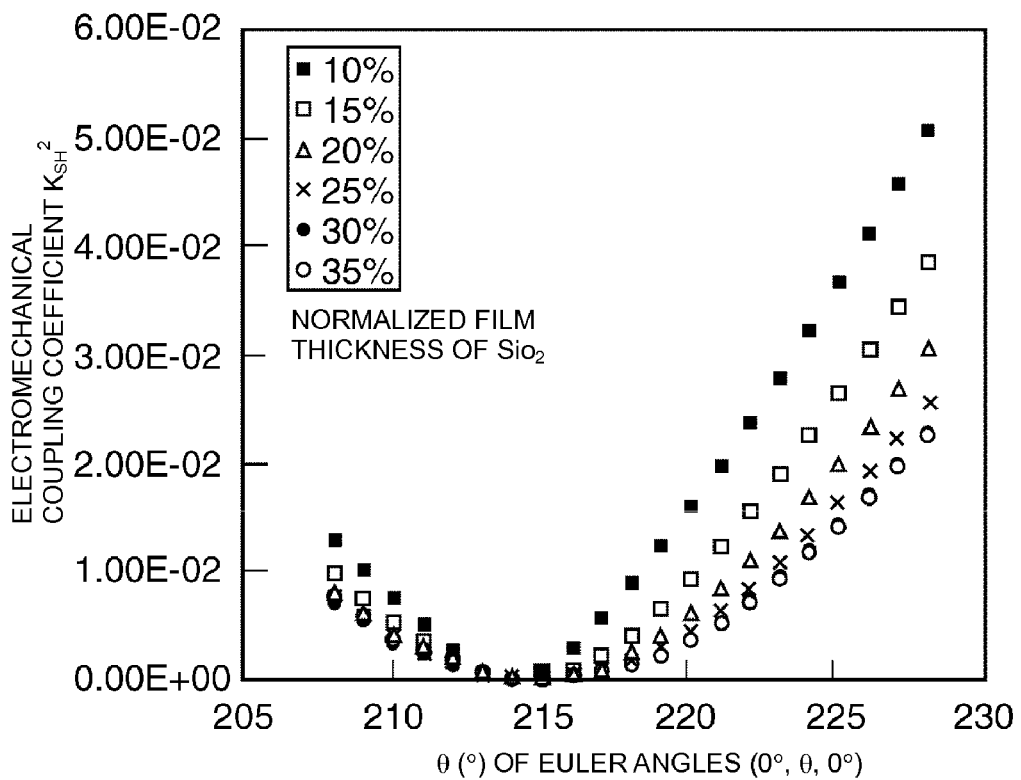
FIG. 18 is a view showing the relationship between the electromechanical coupling coefficient $K_{SH}^2$ of the SH wave and the Euler angle θ which is obtained when an IDT electrode of Pt having a normalized film thickness of about 4.5% is formed in grooves formed in a LiNbO₃ substrate having Euler angles (0°, θ, 0°), and SiO₂ layers having various film thicknesses are formed.

FIGS. 17 and 18 are views each showing the relationship between the Euler angle θ and the electromechanical coupling coefficient $K_R^2$ of the Rayleigh wave or the electromechanical coupling coefficient $K_{SH}^2$ of the SH wave which is obtained at each normalized film thickness of the SiO$_2$ film when the normalized film thickness h/λ of the IDT electrode 3 made of Pt is about 4.5%.

Figure 19:
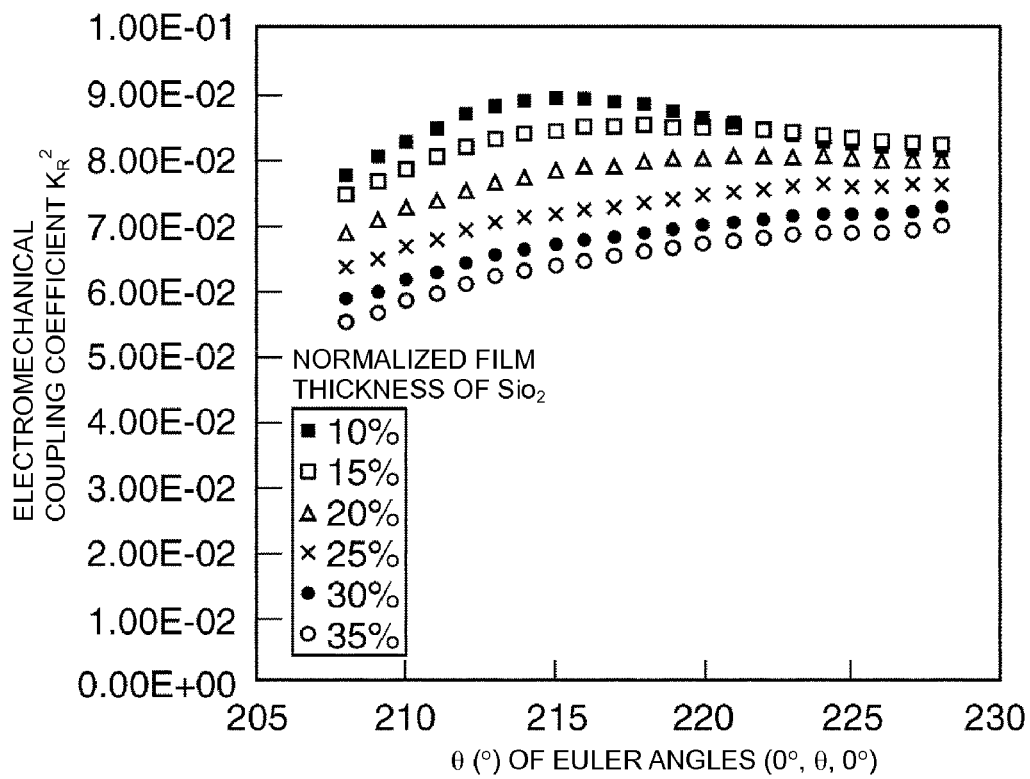
FIG. 19 is a view showing the relationship between the electromechanical coupling coefficient $K_R^2$ of the Rayleigh wave and the Euler angle θ which is obtained when an IDT electrode of Pt having a normalized film thickness of about 5% is formed in grooves formed in a LiNbO₃ substrate having Euler angles (0°, θ, 0°), and SiO₂ layers having various film thicknesses are formed.
Figure 20:
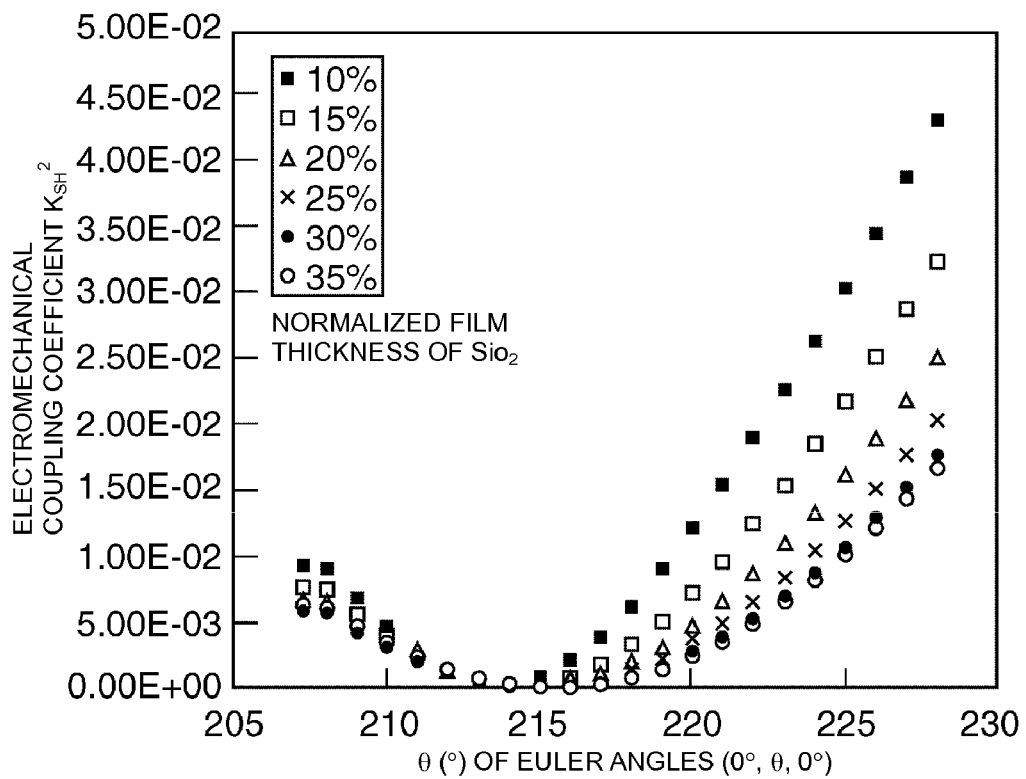
FIG. 20 is a view showing the relationship between the electromechanical coupling coefficient $K_{SH}^2$ of the SH wave and the Euler angle θ which is obtained when an IDT electrode of Pt having a normalized film thickness of about 5% is formed in grooves formed in a LiNbO₃ substrate having Euler angles (0°, θ, 0°), and SiO₂ layers having various film thicknesses are formed.

FIGS. 19 and 20 are views each showing the relationship between the Euler angle θ and the electromechanical coupling coefficient $K_R^2$ of the Rayleigh wave or the electromechanical coupling coefficient $K_{SH}^2$ of the SH wave which is obtained at each normalized film thickness of the SiO$_2$ film when the normalized film thickness h/λ of the IDT electrode 3 made of Pt is about 5%.

Figure 21:
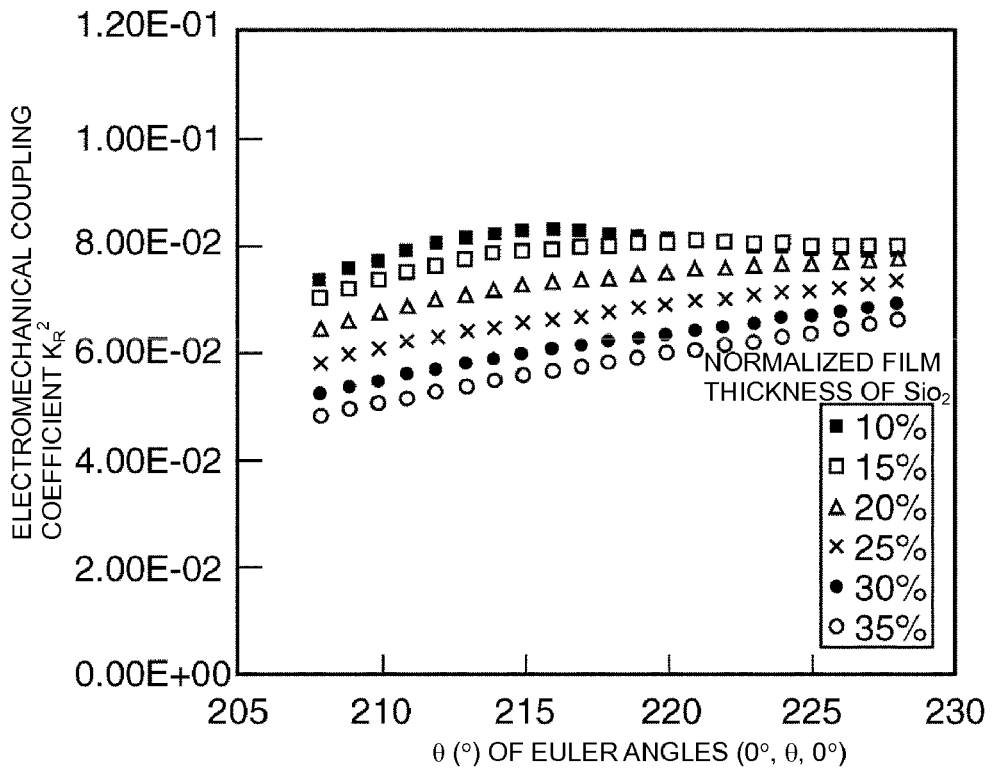
FIG. 21 is a view showing the relationship between the electromechanical coupling coefficient $K_R^2$ of the Rayleigh wave and the Euler angle θ which is obtained when an IDT electrode of Pt having a normalized film thickness of about 5.5% is formed in grooves formed in a LiNbO₃ substrate having Euler angles (0°, θ, 0°), and SiO₂ layers having various film thicknesses are formed.
Figure 22:
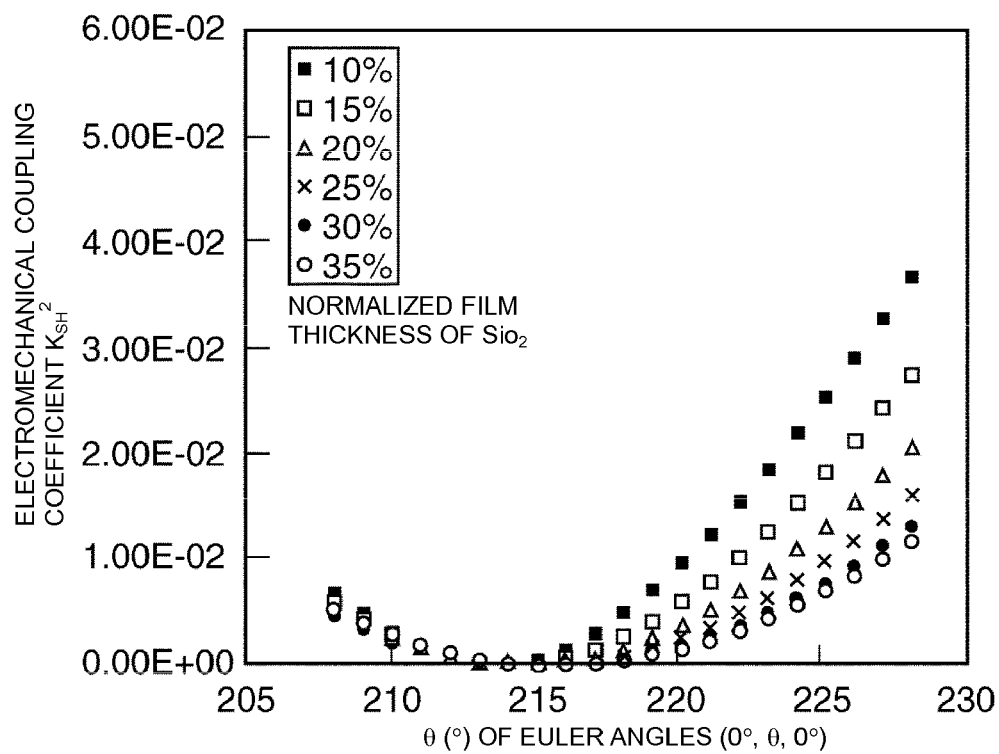
FIG. 22 is a view showing the relationship between the electromechanical coupling coefficient $K_{SH}^2$ of the SH wave and the Euler angle θ which is obtained when an IDT electrode of Pt having a normalized film thickness of about 5.5% is formed in grooves formed in a LiNbO₃ substrate having Euler angles (0°, θ, 0°), and SiO₂ layers having various film thicknesses are formed.

FIGS. 20 and 21 are views each showing the relationship between the Euler angle θ and the electromechanical coupling coefficient $K_R^2$ of the Rayleigh wave or the electromechanical coupling coefficient $K_{SH}^2$ of the SH wave which is obtained at each normalized film thickness of the SiO$_2$ film when the normalized film thickness h/λ of the IDT electrode 3 made of Pt is about 5.5%.

As apparent from FIGS. 5 to 22, when the normalized film thickness of the IDT electrode 3 made of Pt is in the range of about 1.5% to about 5.5%, and the normalized film thickness of the $SiO_2$ film 4 is in the range of about 10% to about 35%, regardless of the film thickness of the $SiO_2$ film 4, the electromechanical coupling coefficient $K_R^2$ of the Rayleigh wave is maximized when the Euler angle θ is in the range of about 208° to about 228°. It is found that when the Euler angle θ is decreased as compared to that at which the electromechanical coupling coefficient $K_R^2$ of the Rayleigh wave is maximized, the electromechanical coupling coefficient $K_R^2$ is decreased, and that when the Euler angle θ is increased as compared to that at which the electromechanical coupling coefficient $K_R^2$ of the Rayleigh wave is maximized, as in the case described above, the electromechanical coupling coefficient $K_R^2$ also tends to be decreased.

The electromechanical coupling coefficient $K_{SH}^2$ of the SH wave causing the spurious response is minimized conversely when the Euler angle θ is in the range of about 205° to about 228°. Hence, when the Euler angle θ is set in the range of about 208° to about 228°, besides an increase of the electromechanical coupling coefficient $K_R^2$, the electromechanical coupling coefficient $K_{SH}^2$ can be decreased.

In order to specifically increase the intensity of response and to obtain specifically superior resonant characteristics and filter characteristics, the electromechanical coupling coefficient $K_R^2$ of a main response of the Rayleigh wave is preferably about 0.08 or more. From the results shown in FIGS. 4 to 22, it is found that in order to obtain an electromechanical coupling coefficient $K_R^2$ of about 0.08 or more, the combination among the film thickness of the IDT electrode 3, the film thickness of $SiO_2$, and the Euler angle θ shown in the following Table 3 may be selected.

That is, as shown in Table 3, it is found that when the range of the normalized film thickness (%) of the $SiO_2$ film and the range of the Euler angle θ (degree) shown in the right end column of Table 3 are selected in combination with the range of the normalized film thickness of the IDT electrode made of Pt, the electromechanical coupling coefficient of a main response of a Rayleigh wave to be used can be set to about 0.08 or more, and a sufficient response can be obtained, and furthermore that the influence of the spurious response can be effectively suppressed.

TABLE 3

| IDT ELECTRODE (%) | $SiO_2$ LAYER (%) | (1) θ (DEGREE) TO SATISFY $0.08 \leq K^2$ OF RAYLEIGH WAVE |
|---|---|---|
| 1.5 ≦ FILM THICKNESS OF IDT ELECTRODE < 2.5 | 7.5 ≦ FILM THICKNESS OF $SiO_2$ LAYER < 12.5 | 208 ≦ θ ≦ 227 |
| | 12.5 ≦ FILM THICKNESS OF $SiO_2$ LAYER < 17.5 | 208 ≦ θ ≦ 228 |
| | 17.5 ≦ FILM THICKNESS OF $SiO_2$ LAYER < 22.5 | 208 ≦ θ ≦ 228 |
| | 22.5 ≦ FILM THICKNESS OF $SiO_2$ LAYER < 27.5 | 208 ≦ θ ≦ 227 |
| | 27.5 ≦ FILM THICKNESS OF $SiO_2$ LAYER < 32.5 | 209 ≦ θ ≦ 226 |
| | 32.5 ≦ FILM THICKNESS OF $SiO_2$ LAYER < 37.5 | 211 ≦ θ ≦ 225 |
| 2.5 ≦ FILM THICKNESS OF IDT ELECTRODE < 3.5 | 7.5 ≦ FILM THICKNESS OF $SiO_2$ LAYER < 12.5 | 208 ≦ θ ≦ 228 |
| | 12.5 ≦ FILM THICKNESS OF $SiO_2$ LAYER < 17.5 | 208 ≦ θ ≦ 228 |
| | 17.5 ≦ FILM THICKNESS OF $SiO_2$ LAYER < 22.5 | 208 ≦ θ ≦ 228 |
| | 22.5 ≦ FILM THICKNESS OF $SiO_2$ LAYER < 27.5 | 209 ≦ θ ≦ 228 |
| | 27.5 ≦ FILM THICKNESS OF $SiO_2$ LAYER < 32.5 | 209 ≦ θ ≦ 227 |
| | 32.5 ≦ FILM THICKNESS OF $SiO_2$ LAYER < 37.5 | 210 ≦ θ ≦ 226 |
| 3.5 ≦ FILM THICKNESS OF IDT ELECTRODE < 4.5 | 7.5 ≦ FILM THICKNESS OF $SiO_2$ LAYER < 12.5 | 208 ≦ θ ≦ 228 |
| | 12.5 ≦ FILM THICKNESS OF $SiO_2$ LAYER < 17.5 | 208 ≦ θ ≦ 228 |
| | 17.5 ≦ FILM THICKNESS OF $SiO_2$ LAYER < 22.5 | 210 ≦ θ ≦ 228 |
| | 22.5 ≦ FILM THICKNESS OF $SiO_2$ LAYER < 27.5 | 212 ≦ θ ≦ 226 |
| | 27.5 ≦ FILM THICKNESS OF $SiO_2$ LAYER < 32.5 | 214 ≦ θ ≦ 224 |
| | 32.5 ≦ FILM THICKNESS OF $SiO_2$ LAYER < 37.5 | 214 ≦ θ ≦ 223 |
| 4.5 ≦ FILM THICKNESS OF IDT ELECTRODE < 5.5 | 7.5 ≦ FILM THICKNESS OF $SiO_2$ LAYER < 12.5 | 209 ≦ θ ≦ 227 |
| | 12.5 ≦ FILM THICKNESS OF $SiO_2$ LAYER < 17.5 | 211 ≦ θ ≦ 228 |
| | 17.5 ≦ FILM THICKNESS OF $SiO_2$ LAYER < 22.5 | — |
| | 22.5 ≦ FILM THICKNESS OF $SiO_2$ LAYER < 27.5 | — |
| | 27.5 ≦ FILM THICKNESS OF $SiO_2$ LAYER < 32.5 | — |
| | 32.5 ≦ FILM THICKNESS OF $SiO_2$ LAYER < 37.5 | — |

In addition, in order to effectively suppress the spurious response, the electromechanical coupling coefficient $K_{SH}^2$ of the SH wave is preferably less than about 0.02. From the results shown in FIGS. 4 to 22, it is found that the range in which the electromechanical coupling coefficient $K_{SH}^2$ of the SH wave is less than about 0.02 may be selected based on the combination among the individual ranges shown in the following Table 4.

TABLE 4

| IDT ELECTRODE (%) | $SiO_2$ LAYER (%) | (1) AND (2) θ (DEGREE) TO SATISFY $0.02 > K^2$ OF SH WAVE |
|---|---|---|
| 1.5 ≦ FILM THICKNESS OF IDT ELECTRODE < 2.5 | 7.5 ≦ FILM THICKNESS OF $SiO_2$ LAYER < 12.5 | 208 ≦ θ ≦ 222 |
| | 12.5 ≦ FILM THICKNESS OF $SiO_2$ LAYER < 17.5 | 208 ≦ θ ≦ 222 |
| | 17.5 ≦ FILM THICKNESS OF $SiO_2$ LAYER < 22.5 | 208 ≦ θ ≦ 222 |
| | 22.5 ≦ FILM THICKNESS OF $SiO_2$ LAYER < 27.5 | 208 ≦ θ ≦ 222 |
| | 27.5 ≦ FILM THICKNESS OF $SiO_2$ LAYER < 32.5 | 209 ≦ θ ≦ 223 |
| | 32.5 ≦ FILM THICKNESS OF $SiO_2$ LAYER < 37.5 | 211 ≦ θ ≦ 225 |

TABLE 4-continued

| IDT ELECTRODE (%) | SiO₂ LAYER (%) | (1) AND (2) θ (DEGREE) TO SATISFY 0.02 > K² OF SH WAVE |
|---|---|---|
| 2.5 ≤ FILM THICKNESS OF IDT ELECTRODE < 3.5 | 7.5 ≤ FILM THICKNESS OF SiO₂ LAYER < 12.5 | 208 ≤ θ ≤ 221 |
| | 12.5 ≤ FILM THICKNESS OF SiO₂ LAYER < 17.5 | 208 ≤ θ ≤ 221 |
| | 17.5 ≤ FILM THICKNESS OF SiO₂ LAYER < 22.5 | 208 ≤ θ ≤ 222 |
| | 22.5 ≤ FILM THICKNESS OF SiO₂ LAYER < 27.5 | 209 ≤ θ ≤ 222 |
| | 27.5 ≤ FILM THICKNESS OF SiO₂ LAYER < 32.5 | 209 ≤ θ ≤ 222 |
| | 32.5 ≤ FILM THICKNESS OF SiO₂ LAYER < 37.5 | 210 ≤ θ ≤ 223 |
| 3.5 ≤ FILM THICKNESS OF IDT ELECTRODE < 4.5 | 7.5 ≤ FILM THICKNESS OF SiO₂ LAYER < 12.5 | 208 ≤ θ ≤ 220 |
| | 12.5 ≤ FILM THICKNESS OF SiO₂ LAYER < 17.5 | 208 ≤ θ ≤ 222 |
| | 17.5 ≤ FILM THICKNESS OF SiO₂ LAYER < 22.5 | 210 ≤ θ ≤ 223 |
| | 22.5 ≤ FILM THICKNESS OF SiO₂ LAYER < 27.5 | 212 ≤ θ ≤ 224 |
| | 27.5 ≤ FILM THICKNESS OF SiO₂ LAYER < 32.5 | 214 ≤ θ ≤ 224 |
| | 32.5 ≤ FILM THICKNESS OF SiO₂ LAYER < 37.5 | 214 ≤ θ ≤ 223 |
| 4.5 ≤ FILM THICKNESS OF IDT ELECTRODE < 5.5 | 7.5 ≤ FILM THICKNESS OF SiO₂ LAYER < 12.5 | 209 ≤ θ ≤ 222 |
| | 12.5 ≤ FILM THICKNESS OF SiO₂ LAYER < 17.5 | 211 ≤ θ ≤ 224 |
| | 17.5 ≤ FILM THICKNESS OF SiO₂ LAYER < 22.5 | — |
| | 22.5 ≤ FILM THICKNESS OF SiO₂ LAYER < 27.5 | — |
| | 27.5 ≤ FILM THICKNESS OF SiO₂ LAYER < 32.5 | — |
| | 32.5 ≤ FILM THICKNESS OF SiO₂ LAYER < 37.5 | — |

Accordingly, it is found that when the Euler angle θ is set in the range of about 208° to about 228°, by selecting the normalized film thickness of the IDT electrode and the normalized film thickness of SiO₂, the electromechanical coupling coefficient $K_R^2$ of a Rayleigh wave to be used can be sufficiently increased, and on the other hand, the electromechanical coupling coefficient $K_{SH}^2$ of the SH wave can be decreased, so that the spurious response caused by the SH wave can be effectively suppressed.

Next, when Pt is used as an electrode material, the reflection coefficient of the IDT electrode can be increased as compared to that obtained when Au, Cu, or Ta is used, and this increase in reflection coefficient will be described with reference to particular experimental results.

Figure 23:
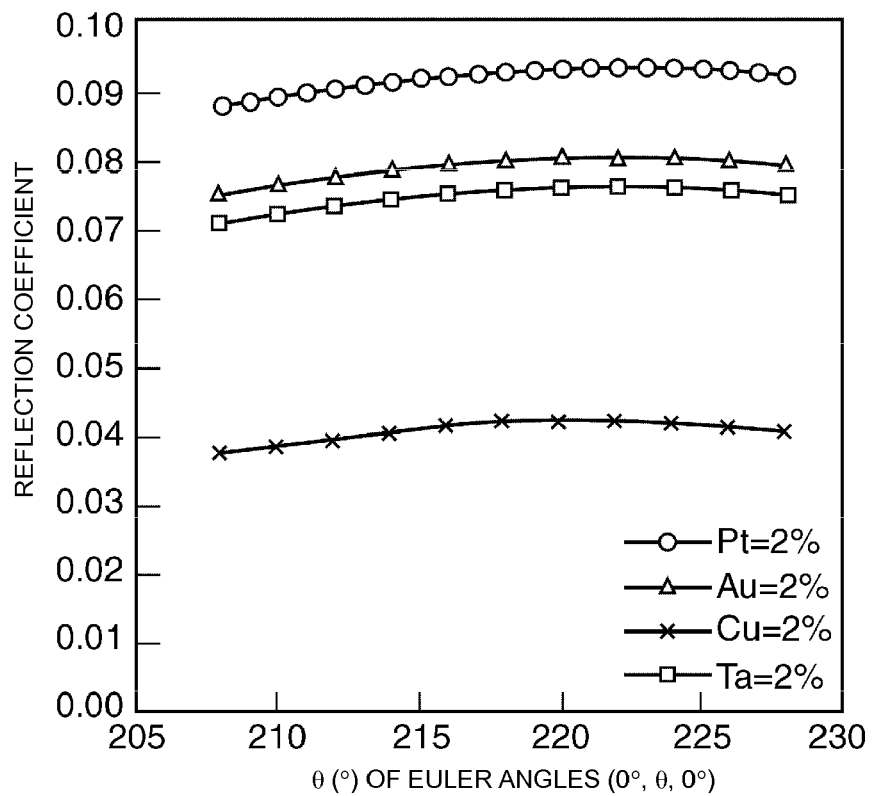
FIG. 23 is a view showing the relationship between a reflection coefficient per one electrode finger and the Euler angle θ which is obtained when an electrode of Pt, Au, Cu, or Ta is formed in grooves formed in a LiNbO₃ substrate having Euler angles (0°, θ, 0°) so as to have a normalized film thickness h/λ of about 2%.
Figure 24:
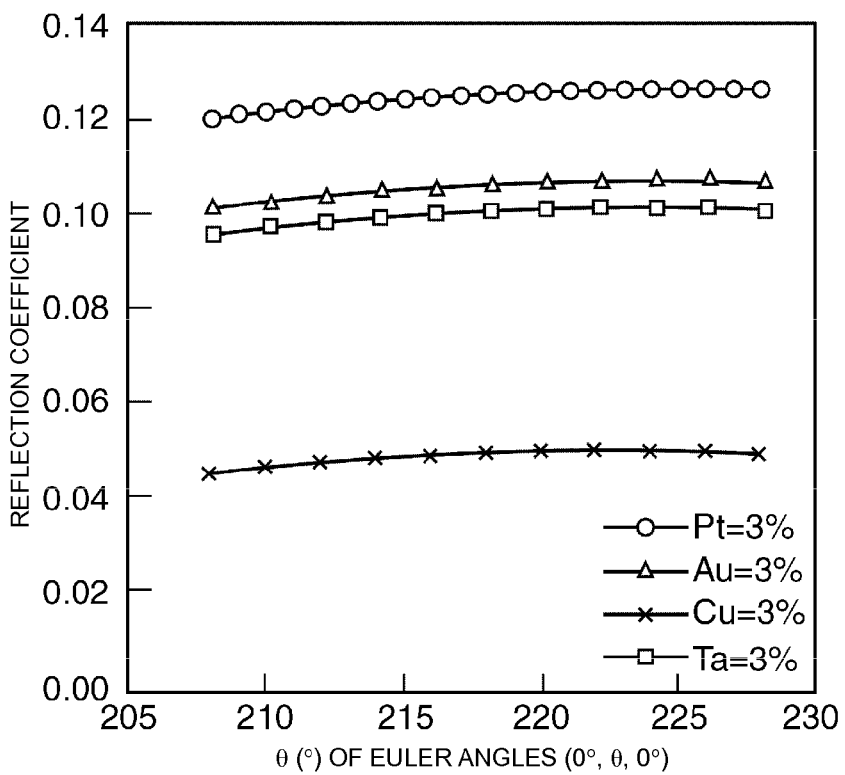
FIG. 24 is a view showing the relationship between the reflection coefficient per one electrode finger and the Euler angle θ which is obtained when an electrode of Pt, Au, Cu, or Ta is formed in grooves formed in a LiNbO₃ substrate having Euler angles (0°, θ, 0°) so as to have a normalized film thickness h/λ of about 3%.
Figure 25:
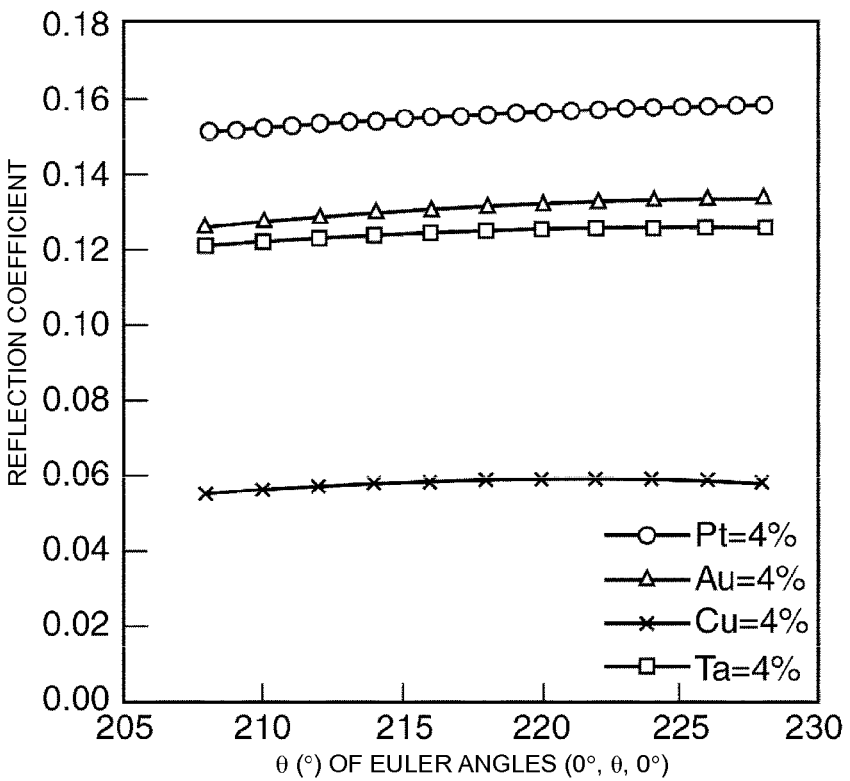
FIG. 25 is a view showing the relationship between the reflection coefficient per one electrode finger and the Euler angle θ which is obtained when an electrode of Pt, Au, Cu, or Ta is formed in grooves formed in a LiNbO₃ substrate having Euler angles (0°, θ, 0°) so as to have a normalized film thickness h/λ of about 4%.

FIG. 23 is a view showing the relationship between the reflection coefficient per one electrode finger and the Euler angle θ in the structure in which various metals are each filled as an electrode material in grooves formed in a LiNbO₃ substrate having Euler angles (0°, θ, 0°) so as to have a normalized film thickness h/λ of about 2% and in which a SiO₂ film is further laminated so as to have a normalized film thickness h/λ of about 25%. In addition, FIGS. 24 to 26 are views showing the evaluation results obtained in a manner similar to that of the case shown in FIG. 23 except that the normalized film thickness of the electrode is set to approximately 2%, 3%, 4%, or 5%, that is, views each showing the relationship between the reflection coefficient and the Euler angle θ of each electrode material.

As apparent from FIGS. 23 to 26, in the range of the Euler angle θ of about 208° to about 228°, when the normalized film thickness h/λ of the electrode is in the range of about 2% to about 5%, it is found that by using Pt as an electrode material, a high reflection coefficient can be obtained as compared to that obtained when Au, Cu, or Ta is used as an electrode material.

In addition, in the above preferred embodiments, although the experiments were performed using a LiNbO₃ substrate having Euler angle (0°, θ, 0°), the Euler angles φ and ψ are not always limited to 0°, and when φ and ψ are each in the range of about 0°±5°, that is, in the range of about −5° to about 5°, the result similar to that of the above experimental examples can be obtained. Hence, according to the present invention, the Euler angles of the LiNbO₃ substrate may be in the approximate range of (0°±5°, 208° to 228°, 0°±5°).

In addition, in the above preferred embodiments, although the IDT electrode 3 was formed of Pt, the electrode material for the IDT electrode 3 is not limited to Pt, and a metal primarily composed of Pt may also be used. In addition, the IDT electrode 3 may be a laminated metal film which includes a metal film of Pt or an alloy primarily composed of Pt and a metal film of another metal or alloy and may be a laminated metal film primarily composed of Pt as a whole. As the another metal or alloy mentioned above, for example, Ti, Ni, Cr, NiCr, or AlCu may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
    a piezoelectric substrate including grooves located in an upper surface thereof;
    an IDT electrode primarily defined by Pt located in the grooves; and
    a SiO₂ layer arranged over the piezoelectric substrate and the IDT electrode and an upper surface thereof which is flat; wherein
    a response of a Rayleigh wave excited in the piezoelectric substrate is utilized, and the piezoelectric substrate is a LiNbO₃ substrate having Euler angles in a range of (0°±5°, 208° to 228°, 0°±5°).

2. The surface acoustic wave device according to claim 1, wherein the IDT electrode includes a laminated metal film in which a film composed of an alloy primarily including at least one metal selected from the group consisting of Ti, Ni, Cr, NiCr, Al, and AlCu is laminated on a film composed of Pt or an alloy primarily including Pt and is a laminated metal film primarily including Pt as a whole.

3. The surface acoustic wave device according to claim 1, wherein a normalized film thickness obtained by normalizing a film thickness of the IDT electrode by a wavelength λ of a surface acoustic wave, a normalized film thickness obtained by normalizing a film thickness of the SiO₂ film by the wavelength λ of the surface acoustic wave, and an angle θ of Euler angles (φ, θ, ψ) of LiNbO₃ are in the ranges of each combination shown in the following Table 1:

TABLE 1

| IDT ELECTRODE (%) | SiO₂ LAYER (%) | (1) θ (DEGREE) TO SATISFY $0.08 \leq K^2$ OF RAYLEIGH WAVE |
|---|---|---|
| 1.5 ≦ FILM THICKNESS OF IDT ELECTRODE < 2.5 | 7.5 ≦ FILM THICKNESS OF SiO₂ LAYER < 12.5 | 208 ≦ θ ≦ 227 |
| | 12.5 ≦ FILM THICKNESS OF SiO₂ LAYER < 17.5 | 208 ≦ θ ≦ 228 |
| | 17.5 ≦ FILM THICKNESS OF SiO₂ LAYER < 22.5 | 208 ≦ θ ≦ 228 |
| | 22.5 ≦ FILM THICKNESS OF SiO₂ LAYER < 27.5 | 208 ≦ θ ≦ 227 |
| | 27.5 ≦ FILM THICKNESS OF SiO₂ LAYER < 32.5 | 209 ≦ θ ≦ 226 |
| | 32.5 ≦ FILM THICKNESS OF SiO₂ LAYER < 37.5 | 211 ≦ θ ≦ 225 |
| 2.5 ≦ FILM THICKNESS OF IDT ELECTRODE < 3.5 | 7.5 ≦ FILM THICKNESS OF SiO₂ LAYER < 12.5 | 208 ≦ θ ≦ 228 |
| | 12.5 ≦ FILM THICKNESS OF SiO₂ LAYER < 17.5 | 208 ≦ θ ≦ 228 |
| | 17.5 ≦ FILM THICKNESS OF SiO₂ LAYER < 22.5 | 208 ≦ θ ≦ 228 |
| | 22.5 ≦ FILM THICKNESS OF SiO₂ LAYER < 27.5 | 209 ≦ θ ≦ 228 |
| | 27.5 ≦ FILM THICKNESS OF SiO₂ LAYER < 32.5 | 209 ≦ θ ≦ 227 |
| | 32.5 ≦ FILM THICKNESS OF SiO₂ LAYER < 37.5 | 210 ≦ θ ≦ 226 |
| 3.5 ≦ FILM THICKNESS OF IDT ELECTRODE < 4.5 | 7.5 ≦ FILM THICKNESS OF SiO₂ LAYER < 12.5 | 208 ≦ θ ≦ 228 |
| | 12.5 ≦ FILM THICKNESS OF SiO₂ LAYER < 17.5 | 208 ≦ θ ≦ 228 |
| | 17.5 ≦ FILM THICKNESS OF SiO₂ LAYER < 22.5 | 210 ≦ θ ≦ 228 |
| | 22.5 ≦ FILM THICKNESS OF SiO₂ LAYER < 27.5 | 212 ≦ θ ≦ 226 |
| | 27.5 ≦ FILM THICKNESS OF SiO₂ LAYER < 32.5 | 214 ≦ θ ≦ 224 |
| | 32.5 ≦ FILM THICKNESS OF SiO₂ LAYER < 37.5 | 214 ≦ θ ≦ 223 |
| 4.5 ≦ FILM THICKNESS OF IDT ELECTRODE < 5.5 | 7.5 ≦ FILM THICKNESS OF SiO₂ LAYER < 12.5 | 209 ≦ θ ≦ 227 |
| | 12.5 ≦ FILM THICKNESS OF SiO₂ LAYER < 17.5 | 211 ≦ θ ≦ 228 |
| | 17.5 ≦ FILM THICKNESS OF SiO₂ LAYER < 22.5 | — |
| | 22.5 ≦ FILM THICKNESS OF SiO₂ LAYER < 27.5 | — |
| | 27.5 ≦ FILM THICKNESS OF SiO₂ LAYER < 32.5 | — |
| | 32.5 ≦ FILM THICKNESS OF SiO₂ LAYER < 37.5 | —. |

4. The surface acoustic wave device according to claim 3, wherein the normalized film thickness obtained by normalizing the film thickness of the IDT electrode by the wavelength λ of the surface acoustic wave, the normalized film thickness obtained by normalizing the film thickness of the SiO₂ film by the wavelength λ of the surface acoustic wave, and the angle θ of the Euler angles (φ, θ, ψ) of LiNbO₃ are in the ranges of each combination shown in the following Table 2:

TABLE 2

| IDT ELECTRODE (%) | SiO₂ LAYER (%) | (1) AND (2) θ (DEGREE) TO SATISFY $0.02 > K^2$ OF SH WAVE |
|---|---|---|
| 1.5 ≦ FILM THICKNESS OF IDT ELECTRODE < 2.5 | 7.5 ≦ FILM THICKNESS OF SiO₂ LAYER < 12.5 | 208 ≦ θ ≦ 222 |
| | 12.5 ≦ FILM THICKNESS OF SiO₂ LAYER < 17.5 | 208 ≦ θ ≦ 222 |
| | 17.5 ≦ FILM THICKNESS OF SiO₂ LAYER < 22.5 | 208 ≦ θ ≦ 222 |
| | 22.5 ≦ FILM THICKNESS OF SiO₂ LAYER < 27.5 | 208 ≦ θ ≦ 222 |
| | 27.5 ≦ FILM THICKNESS OF SiO₂ LAYER < 32.5 | 209 ≦ θ ≦ 223 |
| | 32.5 ≦ FILM THICKNESS OF SiO₂ LAYER < 37.5 | 211 ≦ θ ≦ 225 |
| 2.5 ≦ FILM THICKNESS OF IDT ELECTRODE < 3.5 | 7.5 ≦ FILM THICKNESS OF SiO₂ LAYER < 12.5 | 208 ≦ θ ≦ 221 |
| | 12.5 ≦ FILM THICKNESS OF SiO₂ LAYER < 17.5 | 208 ≦ θ ≦ 221 |
| | 17.5 ≦ FILM THICKNESS OF SiO₂ LAYER < 22.5 | 208 ≦ θ ≦ 222 |
| | 22.5 ≦ FILM THICKNESS OF SiO₂ LAYER < 27.5 | 209 ≦ θ ≦ 222 |
| | 27.5 ≦ FILM THICKNESS OF SiO₂ LAYER < 32.5 | 209 ≦ θ ≦ 222 |
| | 32.5 ≦ FILM THICKNESS OF SiO₂ LAYER < 37.5 | 210 ≦ θ ≦ 223 |
| 3.5 ≦ FILM THICKNESS OF IDT ELECTRODE < 4.5 | 7.5 ≦ FILM THICKNESS OF SiO₂ LAYER < 12.5 | 208 ≦ θ ≦ 220 |
| | 12.5 ≦ FILM THICKNESS OF SiO₂ LAYER < 17.5 | 208 ≦ θ ≦ 222 |
| | 17.5 ≦ FILM THICKNESS OF SiO₂ LAYER < 22.5 | 210 ≦ θ ≦ 223 |
| | 22.5 ≦ FILM THICKNESS OF SiO₂ LAYER < 27.5 | 212 ≦ θ ≦ 224 |
| | 27.5 ≦ FILM THICKNESS OF SiO₂ LAYER < 32.5 | 214 ≦ θ ≦ 224 |
| | 32.5 ≦ FILM THICKNESS OF SiO₂ LAYER < 37.5 | 214 ≦ θ ≦ 223 |
| 4.5 ≦ FILM THICKNESS OF IDT ELECTRODE < 5.5 | 7.5 ≦ FILM THICKNESS OF SiO₂ LAYER < 12.5 | 209 ≦ θ ≦ 222 |
| | 12.5 ≦ FILM THICKNESS OF SiO₂ LAYER < 17.5 | 211 ≦ θ ≦ 224 |
| | 17.5 ≦ FILM THICKNESS OF SiO₂ LAYER < 22.5 | — |
| | 22.5 ≦ FILM THICKNESS OF SiO₂ LAYER < 27.5 | — |
| | 27.5 ≦ FILM THICKNESS OF SiO₂ LAYER < 32.5 | — |
| | 32.5 ≦ FILM THICKNESS OF SiO₂ LAYER < 37.5 | —. |

\* \* \* \* \*